US012610655B2

(12) United States Patent
Lius et al.

(10) Patent No.: US 12,610,655 B2
(45) Date of Patent: Apr. 21, 2026

(54) MANUFACTURING METHOD OF ELECTRONIC DEVICE

(71) Applicant: Innolux Corporation, Miaoli County (TW)

(72) Inventors: Chandra Lius, Miaoli County (TW); Kuan-Feng Lee, Miaoli County (TW); Hsiu-Tung Lin, Miaoli County (TW); Tsau-Hua Hsieh, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 373 days.

(21) Appl. No.: 18/314,836

(22) Filed: May 10, 2023

(65) Prior Publication Data

US 2023/0402563 A1     Dec. 14, 2023

(30) Foreign Application Priority Data

Jun. 14, 2022     (CN) ......................... 202210668262.X

(51) Int. Cl.
H10H 20/01     (2025.01)
H01L 25/075     (2006.01)

(52) U.S. Cl.
CPC ......... H10H 20/01 (2025.01); H01L 25/0753 (2013.01); H10H 20/034 (2025.01); H10H 20/0364 (2025.01)

(58) Field of Classification Search
CPC .. H10H 20/01; H10H 20/034; H10H 20/0364; H10H 20/8514; H10H 20/855; H10H 20/00–882; H10H 29/00–142; H10H 29/30–962; H01L 25/0753; H01L 25/167; H01L 23/14; H01L 23/552; H01L 25/50; H01L 25/042; H01L 25/0655; G06V 10/147; G06V 40/1318

See application file for complete search history.

(56) References Cited

U.S. PATENT DOCUMENTS

2012/0104562 A1*     5/2012     Pagaila ................... H01L 25/03
                                                              257/773
2021/0090908 A1     3/2021     Renjan et al.
2024/0365649 A1*     10/2024     Guo ..................... H10K 59/126

FOREIGN PATENT DOCUMENTS

TW          I693453          5/2020

OTHER PUBLICATIONS

"Office Action of Taiwan Counterpart Application", issued on Jun. 14, 2023, p. 1-p. 7.

* cited by examiner

*Primary Examiner* — Shahed Ahmed
(74) *Attorney, Agent, or Firm* — JCIPRNET

(57)     ABSTRACT

The disclosure provides a manufacturing method of an electronic device, including the following steps. A substrate is provided. A conductive layer is formed on the substrate. An insulating layer is formed on the conductive layer. The insulating layer is patterned to form a first opening and a second opening. A first electronic element is disposed in the first opening and the first electronic element is electrically connected to the conductive layer. A second electronic element is disposed in the second opening and the second electronic element is electrically connected to the conductive layer. The first electronic element and the second electronic element have different functions.

10 Claims, 40 Drawing Sheets

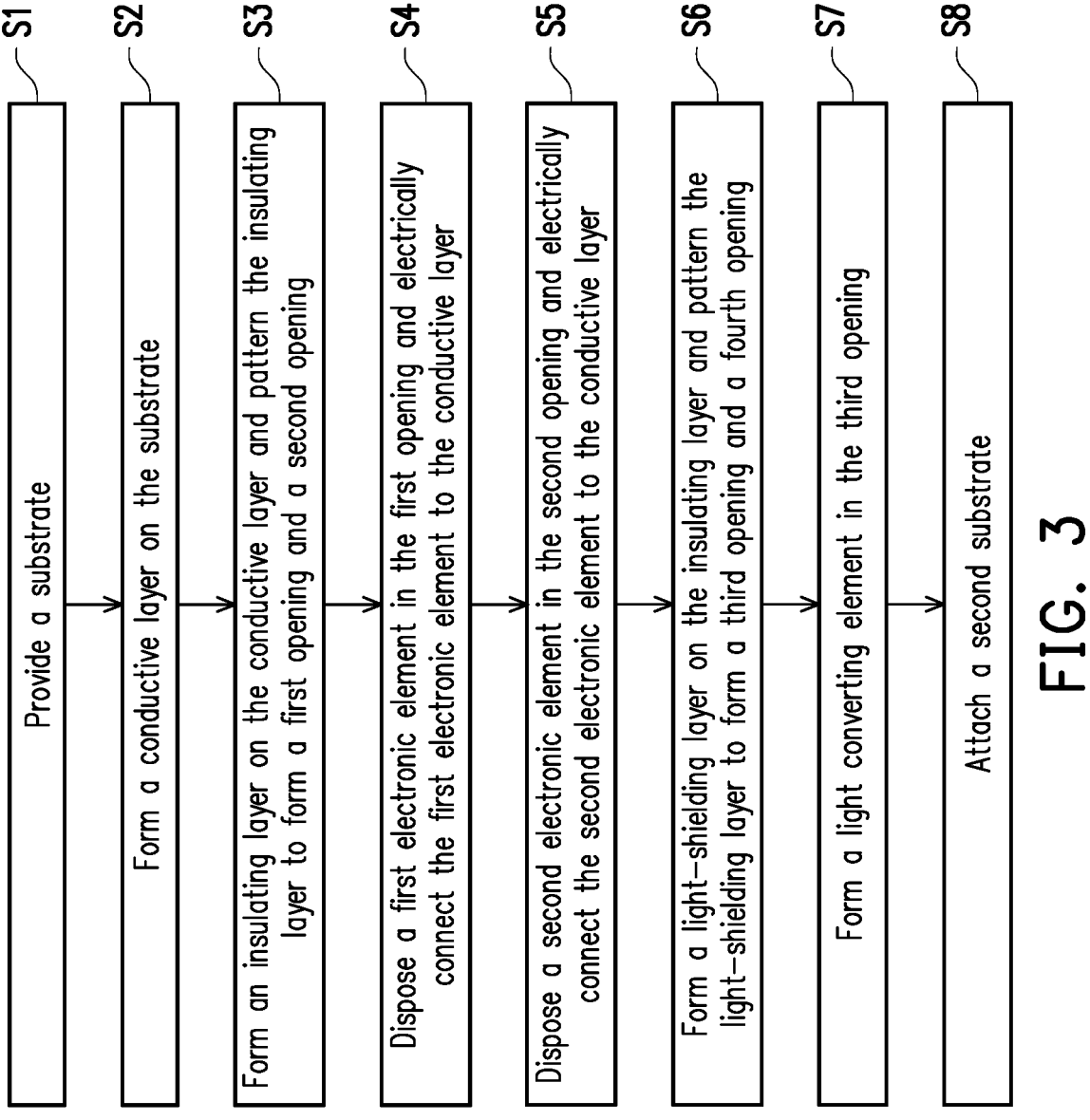

S1 — Provide a substrate

S2 — Form a conductive layer on the substrate

S3 — Form an insulating layer on the conductive layer and pattern the insulating layer to form a first opening and a second opening S4 — Dispose a first electronic element in the first opening and electrically connect the first electronic element to the conductive layer S5 — Dispose a second electronic element in the second opening and electrically connect the second electronic element to the conductive layer S6 — Form a light-shielding layer on the insulating layer and pattern the light-shielding layer to form a third opening and a fourth opening S7 — Form a light converting element in the third opening S8 — Attach a second substrate

FIG. 3

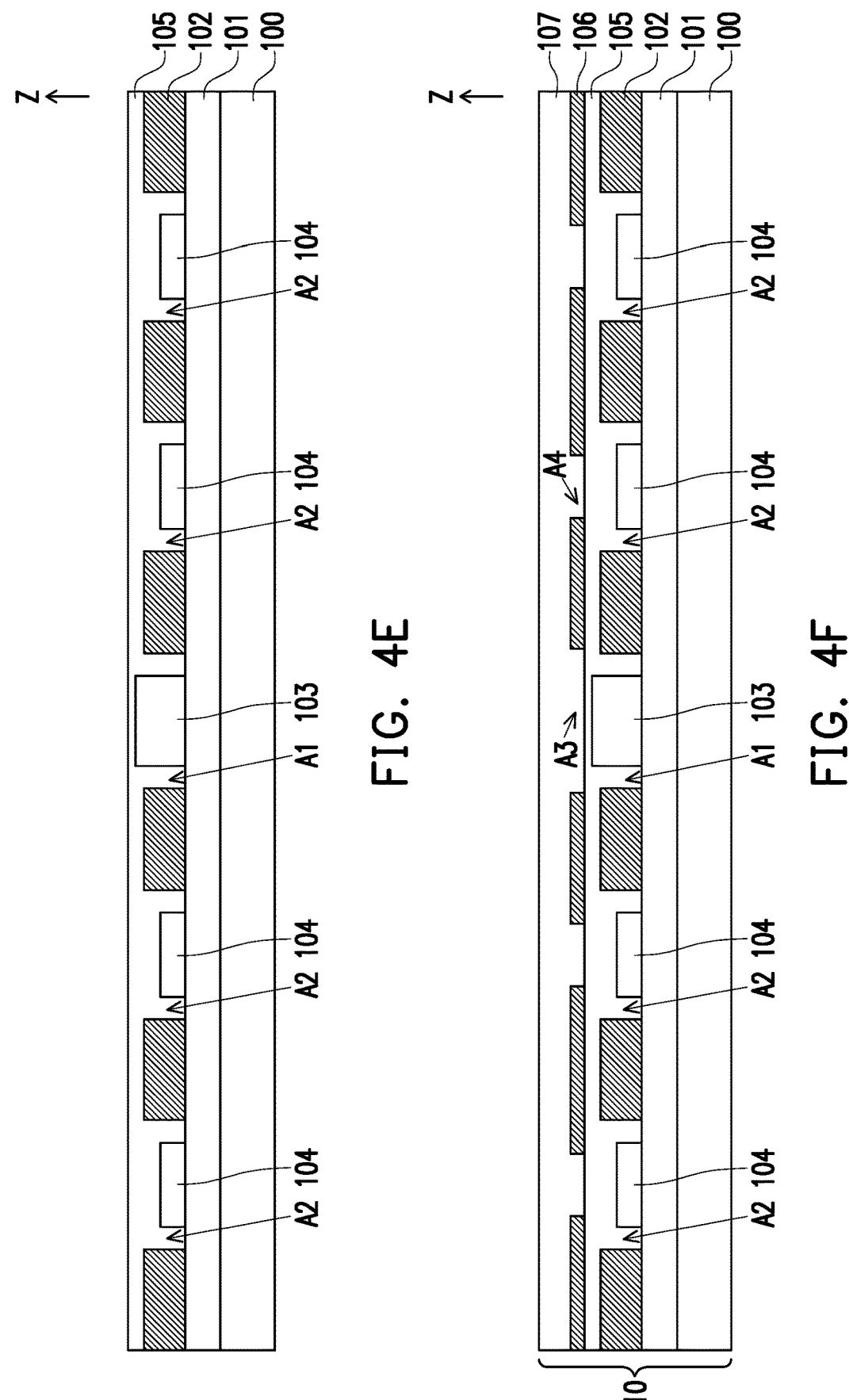

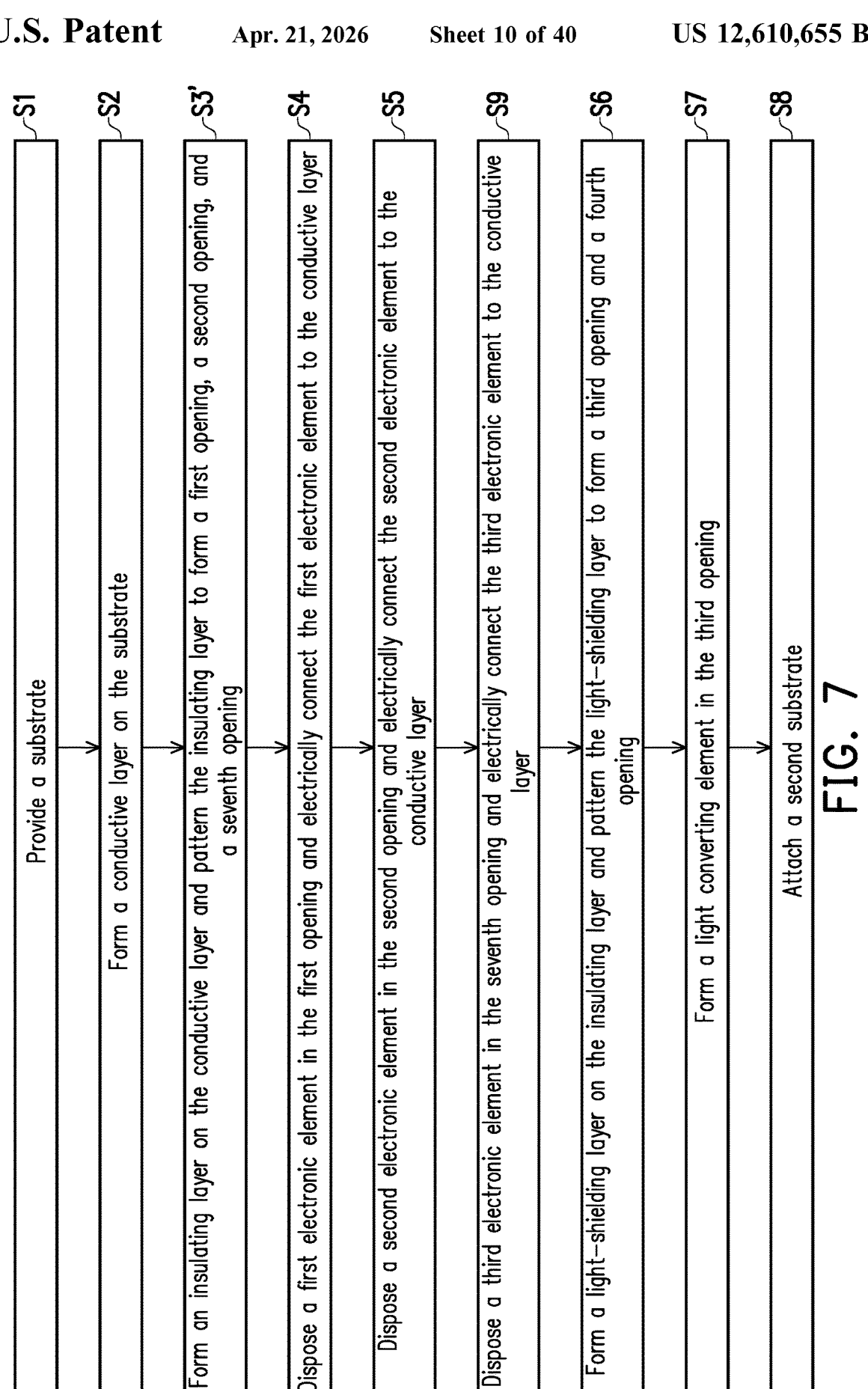

S1 — Provide a substrate

S2 — Form a conductive layer on the substrate

S3' — Form an insulating layer on the conductive layer and pattern the insulating layer to form a first opening, a second opening, and a seventh opening S4 — Dispose a first electronic element in the first opening and electrically connect the first electronic element to the conductive layer S5 — Dispose a second electronic element in the second opening and electrically connect the second electronic element to the conductive layer S9 — Dispose a third electronic element in the seventh opening and electrically connect the third electronic element to the conductive layer S6 — Form a light-shielding layer on the insulating layer and pattern the light-shielding layer to form a third opening and a fourth opening S7 — Form a light converting element in the third opening S8 — Attach a second substrate

FIG. 7

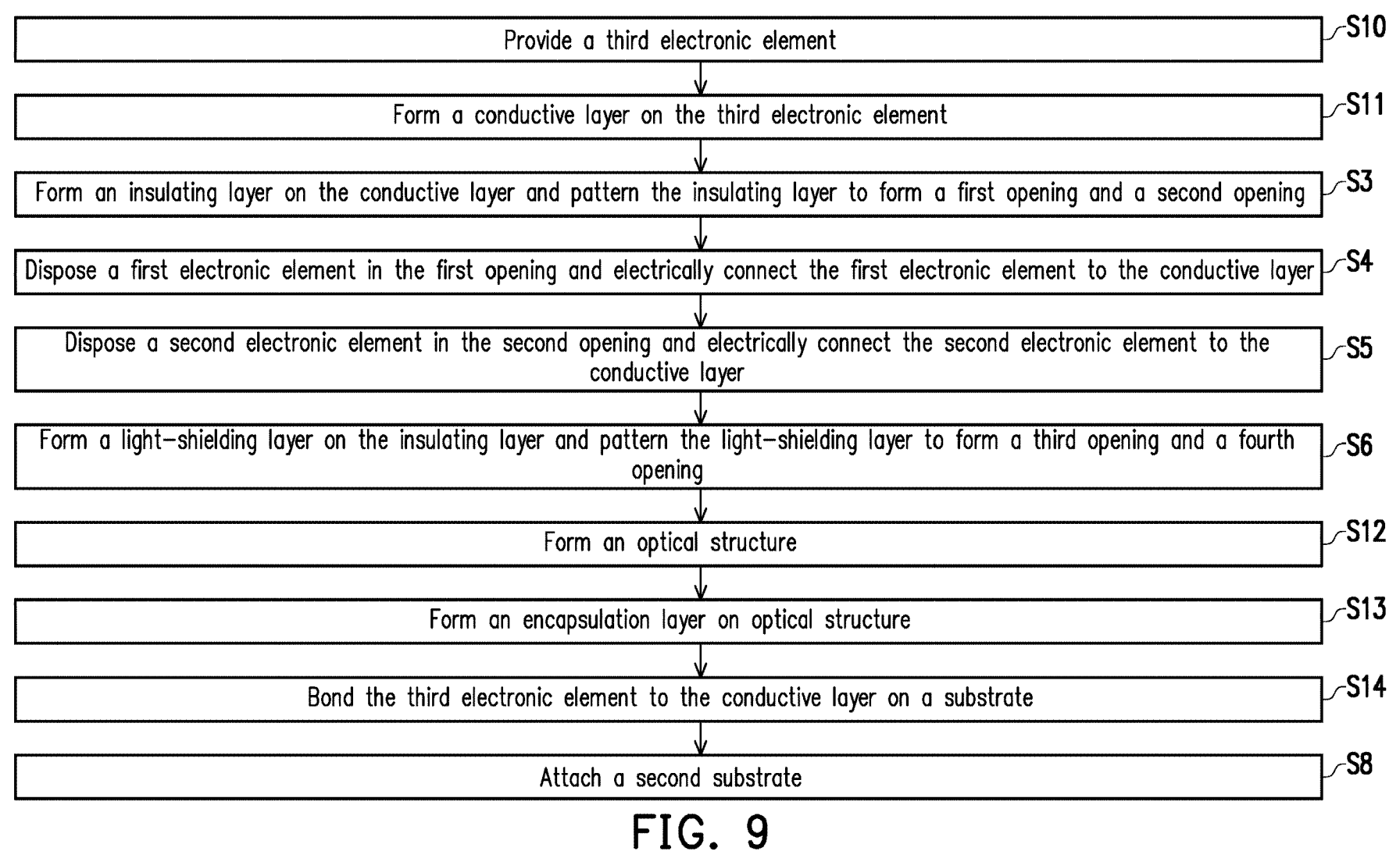

S10 — Provide a third electronic element

S11 — Form a conductive layer on the third electronic element

S3 — Form an insulating layer on the conductive layer and pattern the insulating layer to form a first opening and a second opening S4 — Dispose a first electronic element in the first opening and electrically connect the first electronic element to the conductive layer S5 — Dispose a second electronic element in the second opening and electrically connect the second electronic element to the conductive layer S6 — Form a light-shielding layer on the insulating layer and pattern the light-shielding layer to form a third opening and a fourth opening S12 — Form an optical structure S13 — Form an encapsulation layer on optical structure S14 — Bond the third electronic element to the conductive layer on a substrate S8 — Attach a second substrate

FIG. 9

MANUFACTURING METHOD OF ELECTRONIC DEVICE

CROSS-REFERENCE TO RELATED APPLICATION

This application claims the priority benefit of China application serial no. 202210668262.X, filed on Jun. 14, 2022. The entirety of the above-mentioned patent application is hereby incorporated by reference herein and made a part of this specification.

BACKGROUND

Technical Field

The disclosure relates to a manufacturing method of an electronic device.

Description of Related Art

With the rapid development of technology, electronic devices are developing towards integrated products having multiple functions, such as display function and fingerprint recognition function or image capture function. Therefore, how to manufacture electronic devices having multiple functions has become one of the important research and development issues.

SUMMARY

The disclosure provides a manufacturing method of an electronic device that may manufacture an electronic device having multiple functions.

According to an embodiment of the disclosure, a manufacturing method of an electronic device includes the following steps. A substrate is provided. A conductive layer is formed on the substrate. An insulating layer is formed on the conductive layer. The insulating layer is patterned to form a first opening and a second opening. A first electronic element is disposed in the first opening and the first electronic element is electrically connected to the conductive layer. A second electronic element is disposed in the second opening and the second electronic element is electrically connected to the conductive layer. The first electronic element and the second electronic element have different functions.

In order to make the above features and advantages of the disclosure better understood, embodiments are specifically provided below with reference to figures for detailed description as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

FIG. 3, FIG. 7, and FIG. 9 are schematic flowcharts of a manufacturing method of an electronic device according to a plurality of embodiments of the disclosure, respectively.

FIG. 4A to FIG. 4G, FIG. 11A to FIG. 13C, and FIG. 14A to FIG. 15E are partial cross-sectional schematic diagrams of a manufacturing process of an electronic device according to a plurality of embodiments of the disclosure, respectively.

DESCRIPTION OF THE EMBODIMENTS

Figures 1A, 1B:
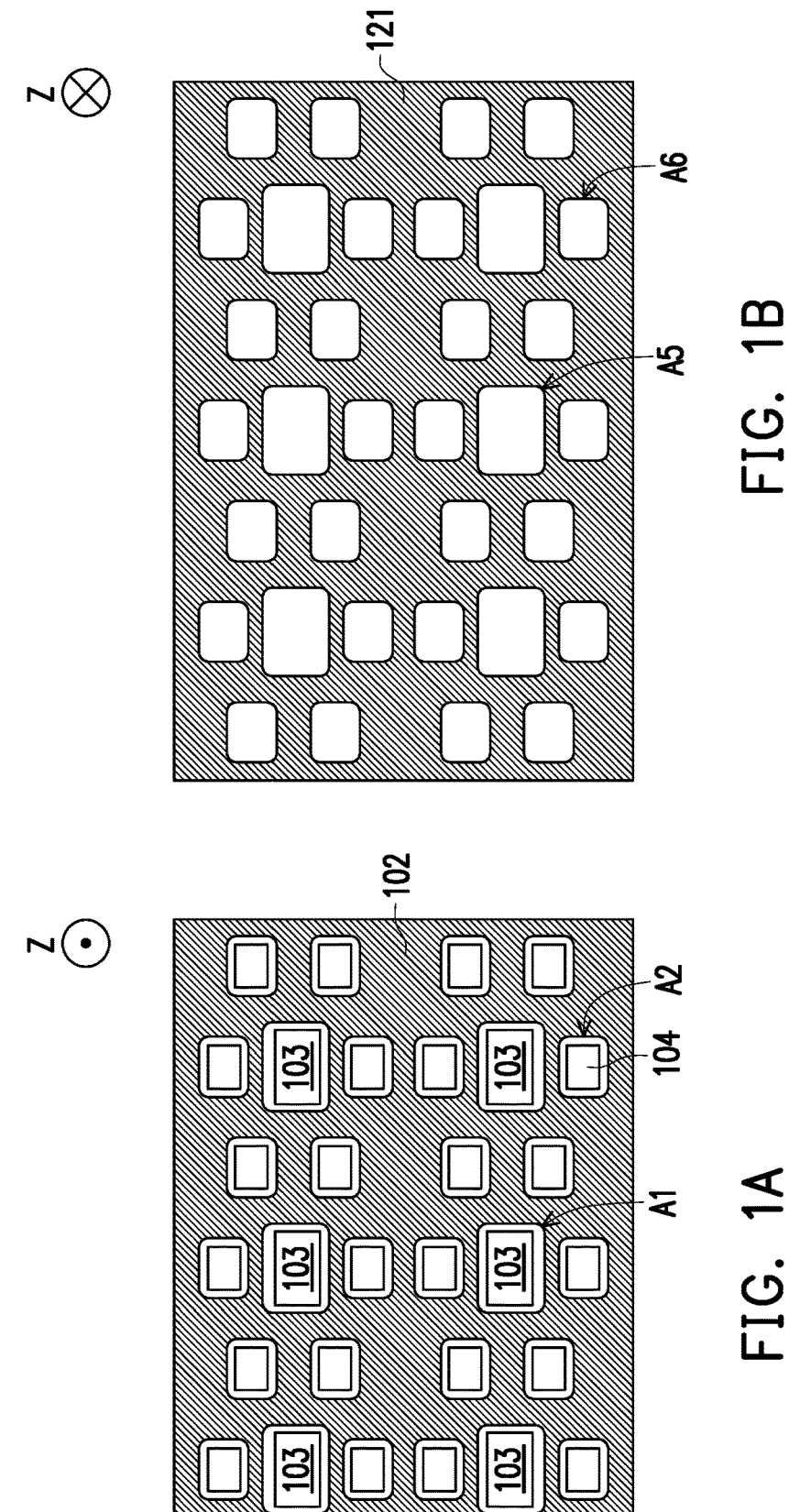
FIG. 1A and FIG. 1B are a partial top schematic diagram and a partial bottom schematic diagram of an electronic device according to an embodiment of the disclosure, respectively.

Hereinafter, exemplary embodiments of the disclosure are described in detail, and examples of the exemplary embodiments are conveyed via the figures. Wherever possible, the same reference numerals are used in the figures and the descriptions to refer to the same or similar portions.

Throughout the disclosure, certain words are used to refer to specific elements in the specification and the claims. Those skilled in the art should understand that electronic device manufacturers may refer to the same components by different names. The present specification does not intend to distinguish between elements that have the same function but different names. In the following description and claims, the words "contain" and "include" and the like are open-ended words, and therefore should be interpreted as "including but not limited to . . . "

In the present specification, wordings used to indicate direction, such as "up," "down," "front," "back," "left," and "right", merely refer to directions in the drawings. Therefore, the directional terms are used to illustrate and are not intended to limit the disclosure. In the drawings, the figures depict typical features of the methods, structures, and/or materials used in the particular embodiments. However, the figures are not to be interpreted as defining or limiting the scope or nature of the embodiments. For example, the relative size, thickness, and location of layers, regions, and/or structures may be reduced or enlarged for clarity.

A structure (or layer, element, or substrate) described in the disclosure located on/above another structure (or layer, element, or substrate) may mean that the two structures are adjacent and directly connected, or may mean that two structures are adjacent rather than directly connected. Indirect connections refer to at least one intermediate structure (or intermediate layer, intermediate element, intermediate substrate, intermediate spacing) between two structures. The lower side surface of a structure is adjacent or directly connected to the upper side surface of the intermediate structure, the upper side surface of the other structure is adjacent or directly connected to the lower side surface of the intermediate structure. The intermediate structure may be formed by a single-layer or multi-layer physical structure or a non-physical structure without limitation. In the disclosure, when a certain structure is disposed "on" other structures, it may mean that the certain structure is "directly" on other structures, or that the certain structure is "indirectly" on other structures, that is, at least one structure is further sandwiched between the certain structure and other structures.

The terms "about", "equal to", "equal" or "same", "substantially" or "essentially" are generally interpreted as within 20% of the given value or range, or interpreted as within 10%, 5%, 3%, 2%, 1%, or 0.5% of a given value or range. In addition, the terms "the range is from a first value to a second value" and "the range is between a first value to a second value" mean the range includes the first value, the second value, and other values in between.

The ordinal numbers used in the specification and claims, such as "first", "second", etc., are used to modify an element. They do not themselves imply and represent that the element(s) have any previous ordinal number, and also do not represent the order of one element and another element, or the order of manufacturing methods. The use of these ordinal numbers is to clearly distinguish an element with a certain name from another element with the same name. The claims and the specification may not use the same terms, and accordingly, the first component in the specification may be the second component in the claims.

The electrical connection or coupling described in the disclosure may refer to direct connection or indirect connection. In the case of direct connection, the endpoints of the components on two circuits are directly connected or connected to each other via a conductor line segment. In the case of indirect connection, there are switches, diodes, capacitors, inductors, resistors, other suitable components, or a combination of the above components between the endpoints of the components on two circuits. However, the disclosure is not limited thereto.

In the disclosure, the thickness, length, and width may be measured by using an optical microscope (OM), and the thickness or width may be measured by a cross-sectional image in an electron microscope, but the disclosure is not limited thereto. Moreover, if a first direction is perpendicular to a second direction, then the angle between the first direction and the second direction may be between 80 degrees and 100 degrees; and if the first direction is parallel to the second direction, then the angle between the first direction and the second direction may be between 0 degrees and 10 degrees.

It should be noted that the following embodiments may disassemble, replace, recombine, and mix the features of several different embodiments without departing from the spirit of the disclosure to complete other embodiments. As long as the features between the embodiments do not violate the spirit of the disclosure or conflict with each other, they may be mixed and used arbitrarily.

Unless otherwise defined, all terms (including technical and scientific terms) used herein have the same meaning as commonly understood by those of ordinary skill in the art to which this disclosure belongs. It should be understood that, these terms, such as those defined in commonly used dictionaries, should be interpreted as having meaning consistent with the relevant technique and the background or context of the disclosure, and should not be interpreted in an idealized or excessively formal way, unless specifically defined in an embodiment of the disclosure.

In the disclosure, the electronic device may include a display device, a backlight device, an antenna device, a sensing device, or a tiling device, but the disclosure is not limited thereto. The electronic device may be a bendable or flexible electronic device. The display device may be a non-self-luminous display device or a self-luminous display device. The electronic device may include, for example, liquid crystal, LED, fluorescence, phosphor, quantum dot (QD), other suitable display media, or a combination of the above. The antenna device may be a liquid-crystal antenna device or a non-liquid-crystal antenna device, and the sensing device may be a sensing device for sensing capacitance, light, heat, or ultrasonic waves, but the disclosure is not limited thereto. In the disclosure, the electronic device may include an electronic element, and the electronic element may include a passive element and an active element such as a capacitor, a resistor, an inductor, a diode, a transistor, a controller, a light-emitting unit, a photosensitive unit, a drive unit, or an antenna unit. The diode may include an LED or a photodiode. The LED may include, for example, an organic light-emitting diode (OLED), a mini LED, a micro LED, or a quantum dot LED, but the disclosure is not limited thereto. The tiling device may be, for example, a display tiling device or an antenna tiling device, but the disclosure is not limited thereto. It should be noted that the electronic device may be any arrangement and combination of the above, but the disclosure is not limited thereto. In addition, the shape of the electronic device may be rectangular, circular, polygonal, a shape having curved edges, or other suitable shapes. The electronic device may have a peripheral system such as a drive system, a control system, a light source system to support a display device, an antenna device, a wearable device (e.g., including augmented reality or virtual reality), an in-vehicle device (e.g., including a car windshield), or a tiling device.

FIG. 1A and FIG. 1B are a partial top schematic diagram and a partial bottom schematic diagram of an electronic device according to an embodiment of the disclosure, respectively. FIG. 2, FIG. 6, FIG. 8A to FIG. 8C, and FIG. 10 are schematic partial cross-sectional diagrams of an electronic device according to a plurality of embodiments of the disclosure, respectively. FIG. 3, FIG. 7, and FIG. 9 are schematic flowcharts of a manufacturing method of an electronic device according to a plurality of embodiments of the disclosure, respectively. FIG. 4A to FIG. 4G, FIG. 11A to FIG. 13C, and FIG. 14A to FIG. 15E are partial cross-sectional schematic diagrams of a manufacturing process of an electronic device according to a plurality of embodiments of the disclosure, respectively. FIG. 5A and FIG. 5B are partial cross-sectional schematic diagrams respectively illustrating that the first electronic element is disposed in the first opening and the second electronic element is disposed in the second opening using different transfer devices or fixtures.

Figure 2:
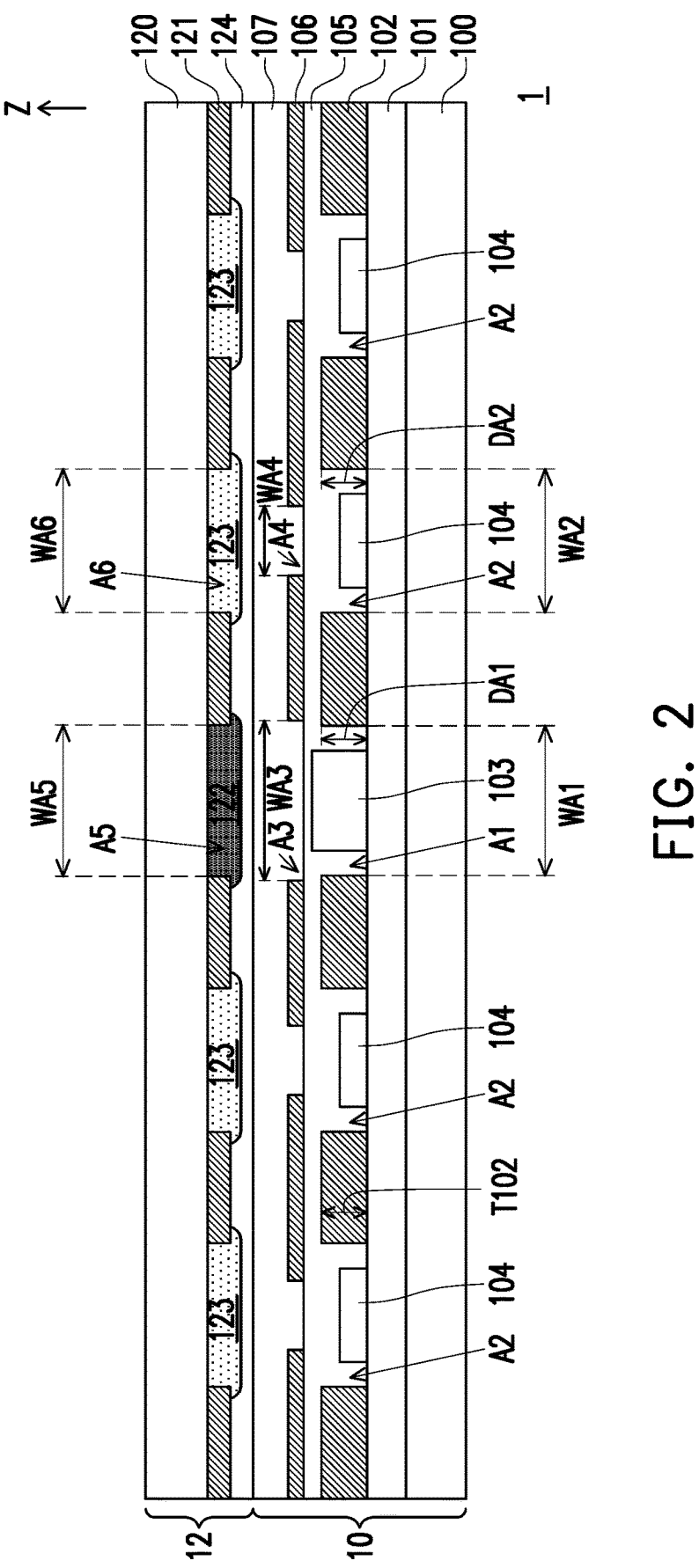
FIG. 2, FIG. 6, FIG. 8A to FIG. 8C, and FIG. 10 are schematic partial cross-sectional diagrams of an electronic device according to a plurality of embodiments of the disclosure, respectively.

Please refer to FIG. 1A, FIG. 1B, and FIG. 2, an electronic device 1 may include a first substrate 10 and a second substrate 12, but the disclosure is not limited thereto. For example, the electronic device 1 may further include a bonding layer (not shown), and the second substrate 12 may be fixed on the first substrate 10 via the bonding layer, but the disclosure is not limited thereto. The bonding layer may include an adhesive layer, such as, but not limited to, optical clear adhesive (OCA) or optical clear resin (OCR). The first substrate 10 is, for example, an array substrate, and the second substrate 12 is, for example, a filter substrate or a cover plate (for protection). The following description will continue with the array substrate and the filter substrate, but the disclosure is not limited thereto.

FIG. 1A shows the first substrate 10 seen from a top view direction (e.g., direction Z) of the electronic device 1, and FIG. 1A schematically illustrates an insulating layer 102, a first electronic element 103, and a second electronic element 104 in the first substrate 10, so as to make the drawing clear and concise. FIG. 1B shows the second substrate 12 seen from the bottom direction of the electronic device 1 (e.g., the opposite direction of direction Z) in an embodiment, and FIG. 1B schematically illustrates a light-shielding layer 121 in the second substrate 12 to make the drawing clear and concise. In another embodiment, when the second substrate is, for example, a cover plate, the light-shielding layer may be omitted, but the disclosure is not limited thereto.

The first substrate 10 may include a substrate 100, a conductive layer 101, an insulating layer 102, a first electronic element 103, and a second electronic element 104, but the disclosure is not limited thereto. For example, as shown in FIG. 2, the first substrate 10 may further include an insulating layer 105, a light-shielding layer 106, and an insulating layer 107, but the disclosure is not limited thereto.

The substrate 100 may be a rigid substrate or a flexible substrate. The material of the substrate 100 includes, for example, glass, quartz, ceramic, sapphire, or plastic, but the disclosure is not limited thereto. The plastic may include polycarbonate (PC), polyimide (PI), polypropylene (PP), polyethylene terephthalate (PET), other suitable flexible materials, or a combination of the above materials, but the disclosure is not limited thereto.

The conductive layer 101 is disposed on the substrate 100. The conductive layer 101 may include a stacked structure of a single-layer conductive layer and at least one insulating layer, a stacked structure of a multi-layer conductive layer and a multi-layer insulating layer, a redistribution layer (RDL) structure, etc., and the conductive layer 101 may also include an electronic element (such as a chip, an active element, and/or a passive element), and the electronic elements may be electrically connected to each other or electrically insulated, but the disclosure is not limited thereto.

The insulating layer 102 is disposed on the conductive layer 101 and may include a first opening A1 and a second opening A2. The first opening A1 is used for accommodating the first electronic element 103, for example, and the second opening A2 is used for accommodating the second electronic element 104, for example. Design parameters such as the relative arrangement and quantity of the first opening A1 and the second opening A2 in the insulating layer 102 may be designed according to actual requirements (e.g., the relative arrangement and quantity of the first electronic element 103 and the second electronic element 104). Taking FIG. 1A as an example, the insulating layer 102 may include a plurality of first openings A1 and a plurality of second openings A2, wherein the plurality of first openings A1 are arranged in an array, for example, and each of the first openings A1 may be surrounded by a plurality of second openings A2, but the disclosure is not limited thereto.

When the function of at least one of the first electronic element 103 and the second electronic element 104 is related to light, for example, when at least one of the first electronic element 103 and the second electronic element 104 has the function of receiving light or emitting light, etc., the insulating layer 102 may include an opaque organic polymer material to reduce issues such as interference and/or light mixing between adjacent electronic elements. The opaque organic polymer material may be a white, gray, or black organic polymer material, such as a black matrix, but the disclosure is not limited thereto. In some embodiments, the insulating layer 102 may also include a transparent organic polymer material. The transparent organic polymer material may include resin, but the disclosure is not limited thereto.

As shown in FIG. 2, the insulating layer 102 may have a single thickness (e.g., a thickness T102), but the disclosure is not limited thereto. Although not shown in FIG. 2, the insulating layer 102 may have a plurality of thicknesses (described later). The thickness T102 of the insulating layer 102 may be the maximum thickness of the insulating layer 102 in the direction Z in any section of the electronic device 1. Under the architecture that the insulating layer 102 has a single thickness, a depth DA1 of the first opening A1 and a depth DA2 of the second opening A2 are the same as or similar to the thickness T102.

The first electronic element 103 is disposed in the first opening A1 and electrically connected to the conductive layer 101, and the second electronic element 104 is disposed in the second opening A2 and electrically connected to the conductive layer 101. For example, the first electronic element 103 and the second electronic element 104 may be fixed on the conductive layer 101 via a conductive member (not shown) and electrically connected to a corresponding circuit and/or drive unit (e.g., chip) in the conductive layer 101, respectively. The conductive member may include a conductive bump (e.g., a solder ball), conductive adhesive, or an anisotropic conductive film (ACF), but the disclosure is not limited thereto.

In some embodiments, as shown in FIG. 1A, one corresponding first electronic element 103 may be disposed in each of the first openings A1, and one corresponding second electronic element 104 may be disposed in each of the second openings A2. In FIG. 1A, since the distribution density of the second openings A2 per unit area is greater than the distribution density of the first openings A1 per unit area, the distribution density of the second electronic elements 104 per unit area is also greater than the distribution density of the first electronic elements 103 per unit area. It should be understood that, design parameters such as the relative arrangement relationship and quantity of the first openings A1 and the second openings A2 may be changed according to actual needs, so as to change design parameters such as the relative arrangement relationship and quantity of the first electronic element 103 and the second electronic element 104.

The first electronic element 103 and the second electronic element 104 may have different functions according to different usage requirements. For example, the functions of the first electronic element 103 and the second electronic element 104 may include two functions, such as the function of emitting light, the function of receiving light, the function of outputting/transmitting a drive signal, and the function of receiving/transmitting/adjusting/changing an electromagnetic wave. The element having the function of emitting light may be, for example, a light-emitting unit. The light-emitting unit may include an organic or inorganic light-emitting diode. In addition, the light-emitting unit may be a single-color light-emitting diode or a package of multi-color (e.g., red, green, and blue) light-emitting diodes. The element having the function of receiving light may be, for example, a photosensitive unit. The photosensitive unit may include, but not limited to, a camera unit, an image sensor, or a fingerprint sensor, but the disclosure is not limited thereto. The element having the function of outputting/transmitting a drive signal may be, for example, a drive unit. The drive unit may include, but is not limited to, a micro IC. The element having the function of receiving/transmitting/adjusting/changing an electromagnetic wave may be, for example, an antenna unit. The antenna unit may include a variable capacitance element, such as a varactor or a large-volume liquid-crystal element, but the disclosure is not limited thereto. The capacitance of the variable capacitance element or the large-volume liquid-crystal element may be changed by applying a positive bias voltage to the variable capacitance element or the large-volume liquid-crystal element, thereby controlling, for example, the frequency or direction of an electromagnetic wave. Moreover, light detection may be performed by applying a negative bias voltage to the variable capacitance element or the large-volume liquid-crystal element. In some embodiments, the first electronic element 103 and the second electronic element 104 may include two elements, such as a light-emitting unit, a photosensitive unit, a drive unit, or an antenna unit, etc., but the disclosure is not limited thereto.

The insulating layer 105 is disposed on the insulating layer 102 and covers the first electronic element 103 and the second electronic element 104. The material of the insulating layer 105 includes, for example, an organic insulating material, an inorganic insulating material, or a combination thereof. The organic insulating material includes, for example, PMMA, an epoxy resin, an acrylic-based resin, silicone, a polyimide polymer, or a combination of the above, but the disclosure is not limited thereto. The inorganic insulating material includes, for example, silicon oxide or silicon nitride, but the disclosure is not limited thereto.

The light-shielding layer 106 may be provided when the function of at least one of the first electronic element 103 and the second electronic element 104 is related to the emission or reception of light.

The light-shielding layer 106 is disposed on the insulating layer 105. The light-shielding layer 106 may be a thin metal layer or an opaque organic polymer layer. When the first electronic element 103 is a light-emitting unit including a function of emitting light and the second electronic element 104 is a photosensitive unit including a function of receiving light, the light-shielding layer 106 may include a third opening A3 and a fourth opening A4. In the top view of the electronic device 1, the third opening A3 is overlapped with the first opening A1, and the fourth opening A4 is overlapped with the second opening A2. In other words, the third opening A3 is at least partially overlapped with the first opening A1 in the direction Z, and the fourth opening A4 is at least partially overlapped with the second opening A2 in the direction Z.

The third opening A3 of the light-shielding layer 106 is disposed corresponding to the first electronic element 103 and may be used as a light channel of the first electronic element 103 to allow the light from the first electronic element 103 (such as the light-emitting unit) to pass through. Therefore, the light generated by the first electronic element 103 may pass through the first opening A1 and the third opening A3 in sequence and have a chance to be output from the electronic device 1. The fourth opening A4 of the light-shielding layer 106 is disposed corresponding to the second electronic element 104 (such as a photosensitive unit) and may be used as a light channel for the second electronic element 104 to allow light incident toward the second electronic element 104 (such as external light or light reflected by the fingerprint) to pass through, so that light incident toward the second electronic element 104 may pass through the fourth opening A4 and the second opening A2 in sequence and have a chance to be received by the second electronic element 104.

The third opening A3 may be designed to be a larger opening than the first opening A1, so as to reduce the shielding of the light emitted by the light-emitting unit by the light-shielding layer 106, thereby increasing the amount of light output from the electronic device 1. Moreover, the fourth opening A4 may be designed to be less than the second opening A2 to collimate light incident toward the second electronic element 104 and reduce interference of large-angle stray light to the second electronic element 104. For example, a width WA3 of the third opening A3 may be greater than a width WA1 of the first opening A1 and a width WA4 of the fourth opening A4, and the width WA4 of the fourth opening A4 may be less than a width WA2 of the second opening A2.

In the present specification, the relative size relationship of the opening widths may be compared from the same section or from different sections. When viewed from the cross-sectional view, the width of the bottom portion of the opening in the section is taken as the width of the opening. When viewed from the top view, if the shape of the opening is an ellipse, the length of the major axis and the length of the minor axis of the ellipse are added and divided by two as the width of the opening. If the shape of the opening is irregular, the length of the diagonal of the smallest rectangle covering the opening is taken as the width of the opening.

The insulating layer 107 is disposed on the light-shielding layer 106. For the material of the insulating layer 107, reference may be made to the material of the insulating layer 105, which is not repeated herein.

In an embodiment, the second substrate 12 may include a substrate 120, the light-shielding layer 121, and an insulating layer 124, but the disclosure is not limited thereto. The second substrate 12 may be provided with or omit one or a plurality of elements or film layers according to different requirements. For example, when the function of at least one of the first electronic element 103 and the second electronic element 104 is related to the emission or reception of light, the second substrate 12 may further include a light converting element 122 and a light filter unit 123, but the disclosure is not limited thereto. In another embodiment, the light-shielding layer 121 may be disposed on the insulating layer 107, and the insulating layer 124 may be disposed between the light-shielding layer 121 and the insulating layer 107 according to different requirements, or an insulating layer may be disposed on the light-shielding layer 121, but the disclosure is not limited thereto. Then, the substrate 120 is disposed on the light-shielding layer 121 to serve as a cover plate, but the disclosure is not limited thereto.

The substrate 120 is disposed opposite to the substrate 100. The substrate 120 may be a rigid substrate or a flexible substrate. For the material of the substrate 120, reference may be made to the material of the above substrate 100, which is not repeated herein.

In an embodiment, the light-shielding layer 121 is disposed on the surface of the substrate 120 facing the substrate 100. The material of the light-shielding layer 121 may include a light-absorbing material, such as a black matrix, but the disclosure is not limited thereto. The light-shielding layer 121 may include a fifth opening A5 and a sixth opening A6 corresponding to the third opening A3 and the fourth opening A4, respectively. In other words, the fifth opening A5 is at least partially overlapped with the third opening A3 in the direction Z, and the sixth opening A6 is at least partially overlapped with the fourth opening A4 in the direction Z.

In some embodiments, a width WA5 of the fifth opening A5 may be greater than or equal to the width WA3 of the third opening A3, so as to reduce the shielding of the light penetrating the third opening A3 by the light-shielding layer 121 to enable light from the third opening A3 to be transmitted upward and have a chance to be output from the electronic device 1, but the disclosure is not limited thereto. In some embodiments, the width WA5 of the fifth opening A5 may be less than the width WA3 of the third opening A3. Moreover, the relative size relationship between a width WA6 of the sixth opening A6 and the width WA4 of the fourth opening A4 may not be limited. That is, the width WA6 of the sixth opening A6 may be less than, equal to, or greater than the width WA4 of the fourth opening A4.

The light converting element 122 is disposed in the fifth opening A5. The light converting element 122 may be used to change the color or waveband of incident light. The material of the light converting element 122 includes, for example, fluorescence, phosphorescence, quantum dots, other suitable light converting materials, light filter materials (such as color resists), or a combination of the above, but the disclosure is not limited thereto. In some other embodiments, although not shown in FIG. 2, the light converting element 122 may be disposed in the third opening A3 of the light-shielding layer 106, so that the fifth opening A5 may not be provided with a light converting element or may be provided with another light converting element. For example, the material of the light converting element in the third opening A3 may be fluorescence, phosphorescence, quantum dots, or a combination of the above, and the material of the light converting element in the fifth opening A5 may be a light filter material, but the disclosure is not limited thereto. In still other embodiments, a transparent polymer material may be used instead of the light converting element 122 to be disposed in the fifth opening A5. For example, when the light-emitting unit is a blue light-emitting diode, in the red pixel, a red light converting element may be disposed in the fifth opening A5, in the green pixel, a green light converting element may be disposed in the fifth opening A5, and in the blue pixel, a transparent polymer material or a blue light filter material may be disposed in the fifth opening A5, but the disclosure is not limited thereto. In the following embodiments, the arrangement position or type of the light converting element 122 may be changed as in the above, and is not repeated herein.

The light filter unit 123 is disposed in the sixth opening A6, so that the light filter unit 123 in the direction Z is at least partially overlapped with the second electronic element 104 (e.g., the photosensitive element). The light filter unit 123 helps to filter stray light in the environment, thereby improving the recognition degree of the photosensitive element. In some embodiments, the light filter unit 123 may be a green light filter unit to filter red light or near-infrared light in the environment, but the disclosure is not limited thereto. In other embodiments, although not shown in FIG. 2, the light filter unit 123 may not be disposed on the second substrate 12. In the following embodiments, the type or setting of the light filter unit 123 may be changed as described above, and is not repeated herein.

In an embodiment, the insulating layer 124 is disposed on the surface of the light-shielding layer 121 facing the substrate 100 and covers the light converting element 122 and the light filter unit 123. The material of the insulating layer 124 may include an organic insulating material, such as polymethyl methacrylate, epoxy resin, acrylic resin, silicone, polyimide polymer, or a combination of the above, but the disclosure is not limited thereto.

Referring further to FIG. 3, a manufacturing method of the electronic device 1 includes the following steps. The substrate 100 is provided (step S1). The conductive layer 101 is formed on the substrate 100 (step S2). The insulating layer 102 is formed on the conductive layer 101, and the insulating layer 102 is patterned to form the first opening A1 and the second opening A2 (step S3). The first electronic element 103 is disposed in the first opening A1 and electrically connected to the conductive layer 101 (step S4). The second electronic element 104 is disposed in the second opening A2 and electrically connected to the conductive layer 101 (step S5), wherein the first electronic element 103 and the second electronic element 104 have different functions. In some embodiments, as shown in FIG. 3, the manufacturing method of the electronic device 1 may further include the following steps. The light-shielding layer 106 is formed on the insulating layer 102, and the light-shielding layer 106 is patterned to form the third opening A3 (step S6). The light converting element 122 is formed in the third opening A3 (step S7). The second substrate 12 is attached (step S8), but the disclosure is not limited thereto.

Figures 4A, 4B:

In detail, for step S1, as shown in FIG. 4A, the substrate 100 may be provided. For the material of the substrate 100, please refer to the above, which is not repeated herein. For step S2, as shown in FIG. 4B, the conductive layer 101 is formed on the substrate 100. For the material of the conductive layer 101, please refer to the above, which is not repeated herein. Regarding step S3, as shown in FIG. 4C, a coating film or a coating process may be used to form an entire insulating layer, and then a patterning process is used to form the insulating layer 102 having the first opening A1 and the second opening A2.

Figures 4C, 4D:
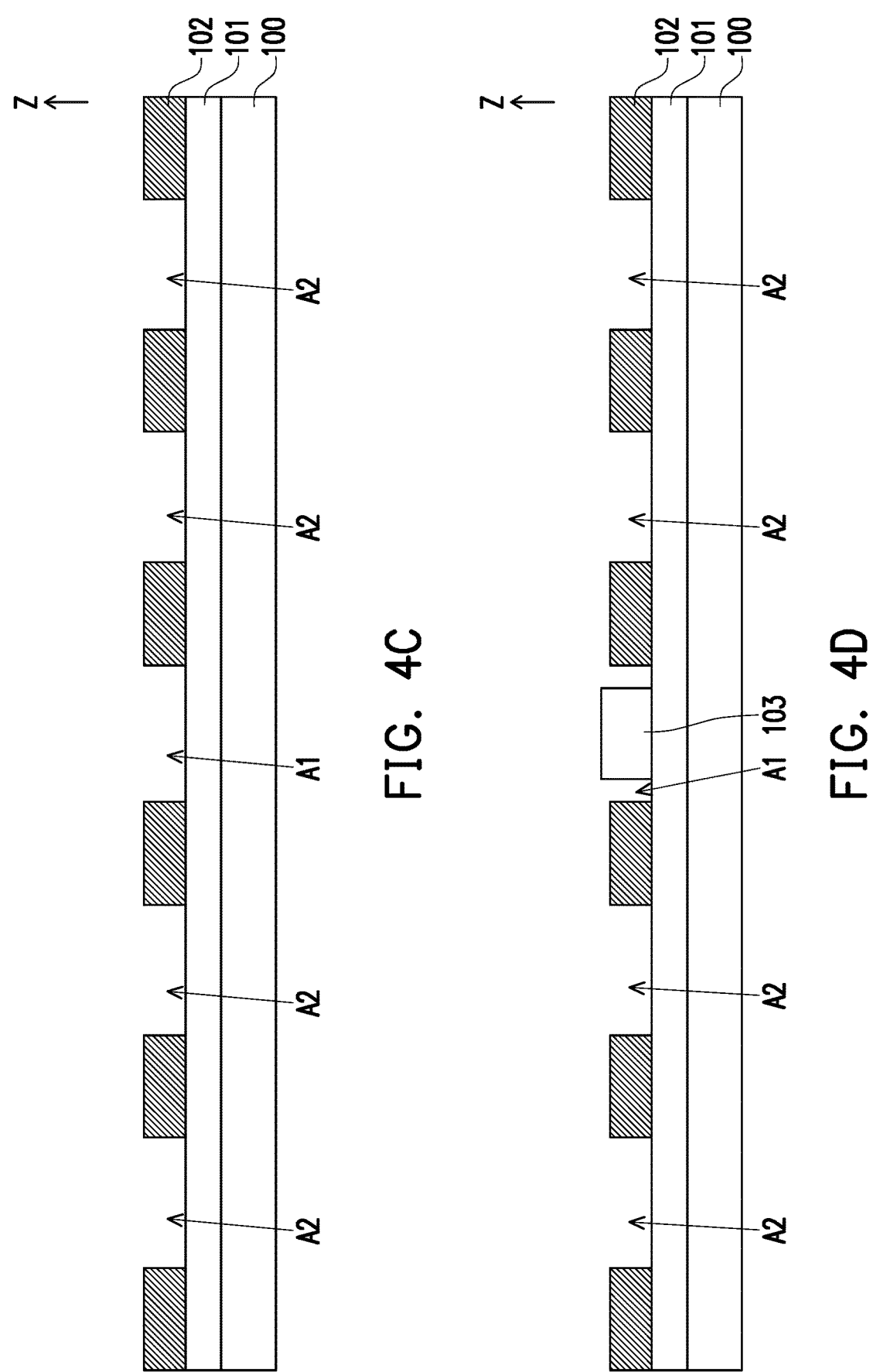
Figures 5A, 5B:
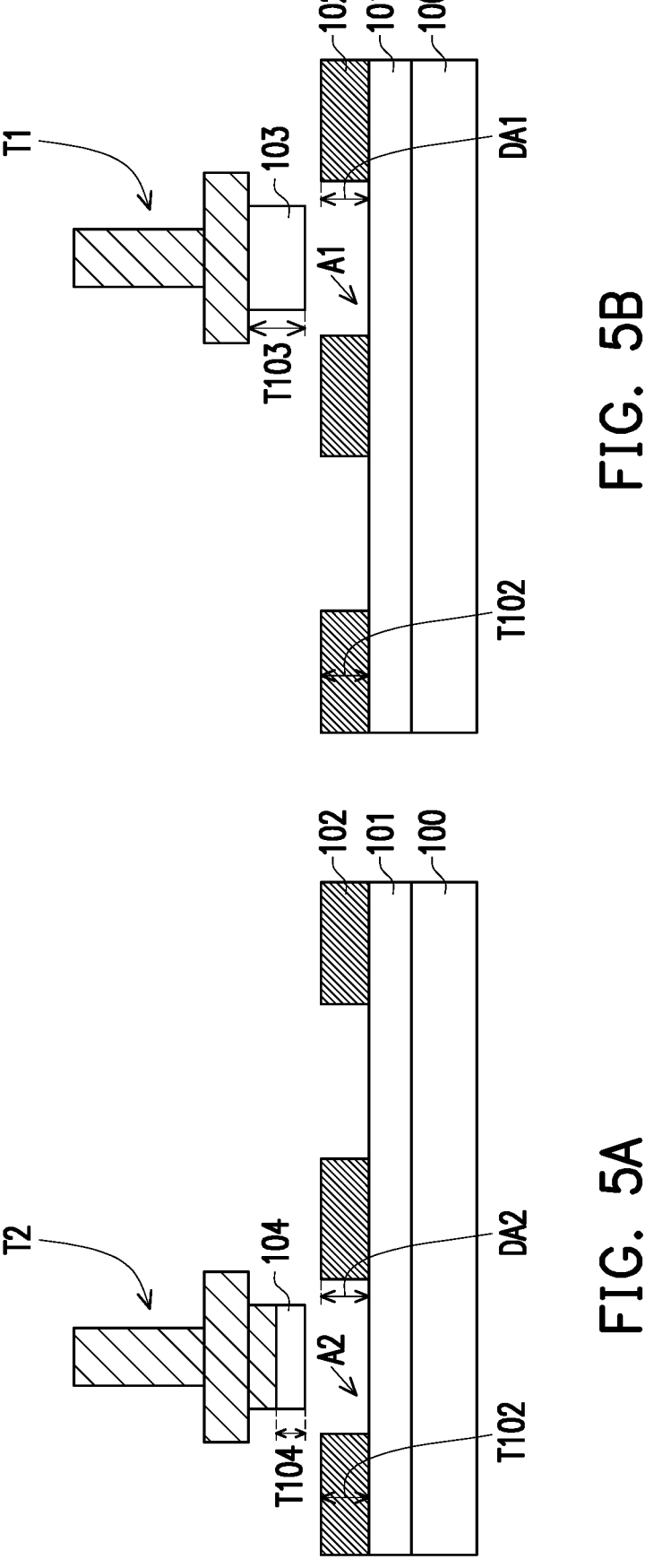
FIG. 5A and FIG. 5B are partial cross-sectional schematic diagrams respectively illustrating that the first electronic element is disposed in the first opening and the second electronic element is disposed in the second opening using different fixtures.

For step S4 and step S5, as shown in FIG. 4D and FIG. 4E, the first electronic element 103 is disposed in the first opening A1 and electrically connected to the conductive layer 101, and the second electronic element 104 is disposed in the second opening A2 and electrically connected to the conductive layer 101. Under the structure in which the first electronic element 103 is a light-emitting unit and the second electronic element 104 is a photosensitive unit, the first electronic element 103 and the second electronic element 104 are electrically insulated from each other, for example, and the first electronic element 103 and the second electronic element 104 are electrically connected to different circuits (not shown) in the conductive layer 101, for example, respectively.

Although not shown, the sequence of step S4 and step S5 may be reversed. That is, the second electronic element 104 may be disposed in the second opening A2 first, and then the first electronic element 103 may be disposed in the first opening A1.

After the first electronic element 103 and the second electronic element 104 are disposed, the insulating layer 105 may be formed next, and the insulating layer 105 may be, for example, a flat layer to provide a flat surface, in order to reduce the difficulty of the subsequent process (e.g., forming the light-shielding layer 106) or improve the yield of the subsequent process, but the disclosure is not limited thereto. For the material of the insulating layer 105, please refer to the above, which is not repeated herein.

For step S6, as shown in FIG. 4F, the light-shielding layer 106 is formed on the insulating layer 105. For example, an entire light-shielding layer may be formed first, and then the third opening A3 and the fourth opening A4 may be formed via a patterning process to form the light-shielding layer 106.

Figure 4G:
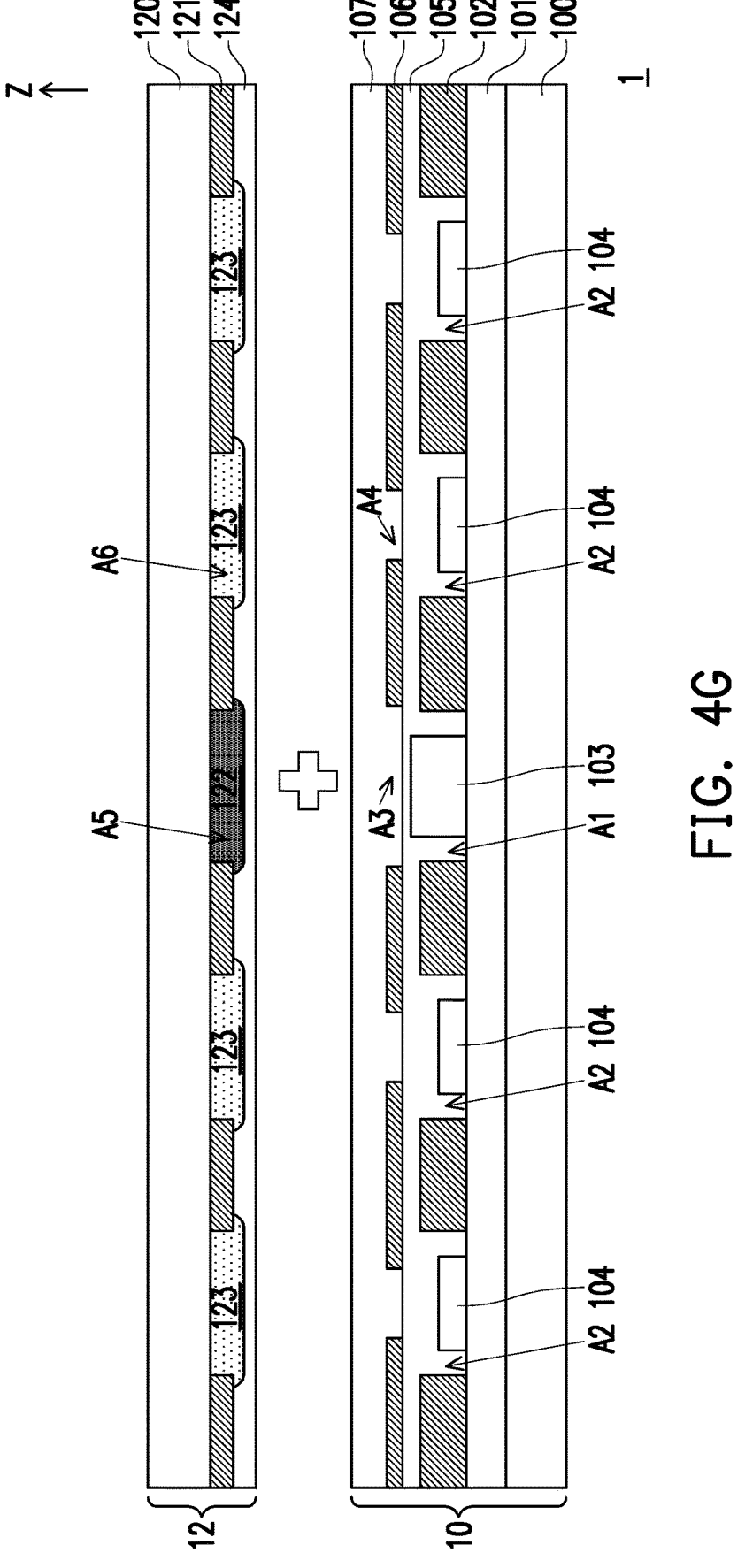

For step S7, although not shown in FIG. 4F or FIG. 4G, a light converting element (such as the light converting element 122 shown in FIG. 2) may be formed in the third opening A3, and thus, the fifth opening A5 in the second substrate 12 (refer to FIG. 4G) may not be provided with a light converting element, or another light converting element (such as a light filter unit) may be disposed in the fifth opening A5 in the second substrate 12. Alternatively, as shown in FIG. 4G, the light converting element 122 may be disposed in the fifth opening A5 in the second substrate 12, and thus, the manufacturing method of the electronic device 1 may omit step S7.

Next, the insulating layer 107 may be further formed on the light converting element (if any), the light-shielding layer 106, and the insulating layer 105. For the material of the insulating layer 107, please refer to the above, which is not repeated herein. As a result, the manufacture of the first substrate 10 is preliminarily completed.

In another embodiment, the light-shielding layer 121 may be further formed on the insulating layer 107, and the light-shielding layer 121 may be patterned to form the fifth opening A5 and/or the sixth opening A6. Then, the light converting element 122 may be disposed in the fifth opening A5 and/or the light filter unit 123 may be disposed in the sixth opening A6, respectively. Next, an insulating layer may be optionally formed on the light-shielding layer 121 to complete the manufacture of the first substrate 10.

For step S8, as shown in FIG. 4G, the second substrate 12 is attached onto the first substrate 10. For example, the second substrate 12 may be fixed on the first substrate via a bonding layer (not shown; such as an adhesive layer), but the disclosure is not limited thereto. In another embodiment, the second substrate 12 may include the substrate 120 and be fixed on the first substrate 10, but the disclosure is not limited thereto.

Referring to FIG. 5A and FIG. 5B, the method of disposing the first electronic element 103 and the second electronic element 104 into the first opening A1 and the second opening A2 is, for example, via at least one transfer equipment or fixture, and the transfer equipment or fixture includes at least one transfer head for transferring the first electronic element 103 and the second electronic element 104, but the disclosure is not limited thereto.

When the first electronic element 103 and the second electronic element 104 have different functions, the first electronic element 103 and the second electronic element 104 may have different thicknesses. When the electronic elements are packaged to form electronic modules, different electronic modules may have different heights. Since the thicknesses of the first electronic element 103 and the second electronic element 104 are different or the heights of the resulting electronic modules are different, for example, a thickness T103 of the first electronic element 103 is greater than a thickness T104 of the second electronic element 104, the insulating layer 102 has a single thickness T102, and the thickness T102 of the insulating layer 102 is, for example, greater than the thickness T104 of the second electronic element 104 and less than the thickness T103 of the first electronic element 103, and the first electronic element 103 and the second electronic element 104 may be transferred respectively via two transfer equipment or fixtures (such as the transfer head T1 and the transfer head T2) in order to reduce the probability that the transfer equipment or the fixture is in contact with the insulating layer 102 during the process of transferring the electronic elements (such as the first electronic element 103 or the second electronic element 104). Thereby, the integrity of the insulating layer 102 or the bonding degree between the electronic elements and the conductive layer 101 is maintained.

Figure 6:
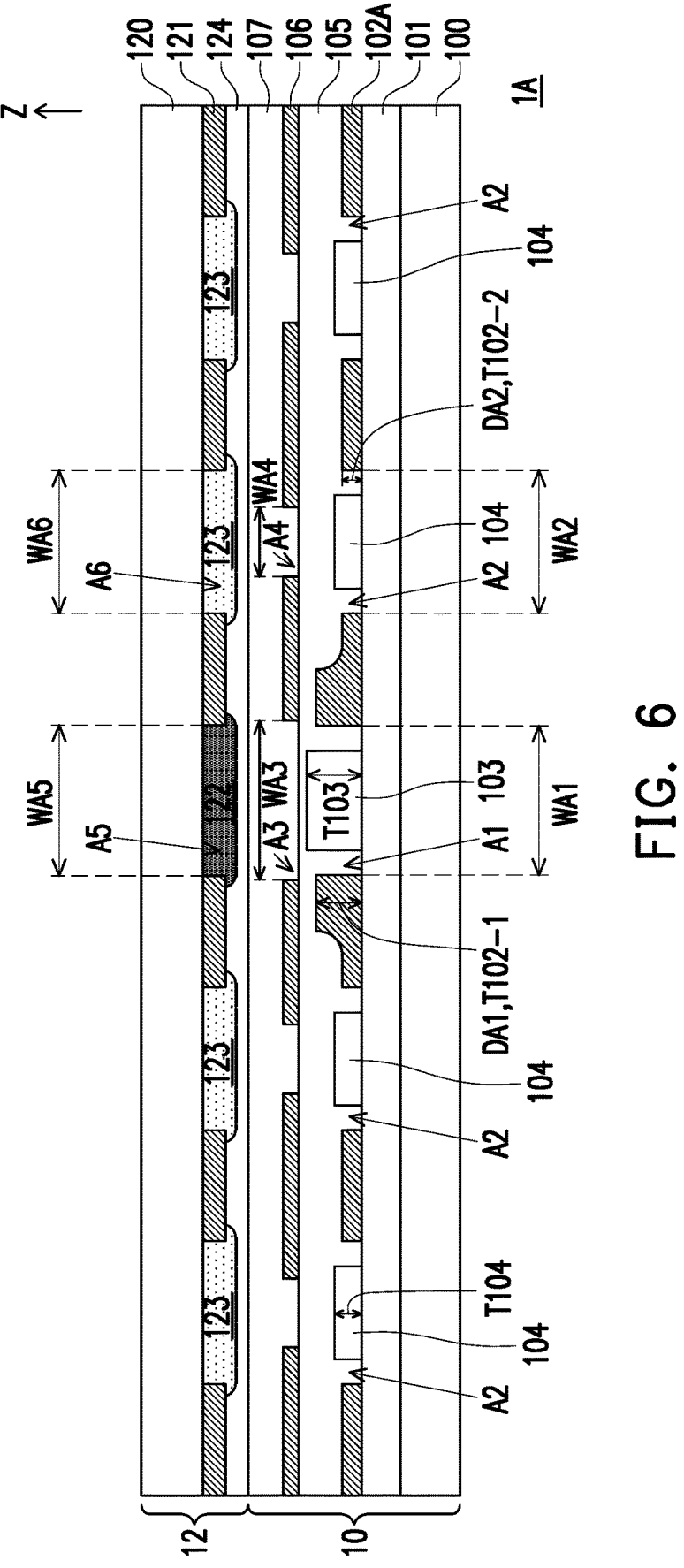

Referring to FIG. 6, the main difference between an electronic device 1A and the electronic device 1 of FIG. 2 is that an insulating layer 102A in FIG. 6 has a plurality of thicknesses. For example, the insulating layer 102A having a plurality of thicknesses may be formed via a grayscale mask, but the disclosure is not limited thereto.

In detail, the thickness of the insulating layer 102A is designed, for example, according to the thicknesses of the first electronic element 103 and the second electronic element 104. Taking FIG. 6 as an example, a thickness T102-1 of the insulating layer 102A adjacent to the first opening A1 may be designed to be slightly less than the thickness T103 of the first electronic element 103, and a thickness T102-2 of the insulating layer 102A adjacent to the second opening A2 may be designed to be slightly less than the thickness T104 of the second electronic element 104. In this way, the first electronic element 103 and the second electronic element 104 may be transferred via a single transfer equipment or fixture.

As shown in FIG. 6, since the thickness T103 of the first electronic element 103 is greater than the thickness T104 of the second electronic element 104, and the thickness T102-1 of the insulating layer 102A adjacent to the first opening A1 is greater than the thickness T102-2 of the insulating layer 102A adjacent to the second opening A2, wherein a depth DA1 of the first opening A1 is substantially equal to 0.95 times the thickness T102-1 of the insulating layer 102A at the first opening A1, a depth DA2 of the second opening A2 is substantially equal to 0.95 times the thickness T102-2 of the insulating layer 102A at the second opening A2, and the depth DA1 of the first opening A1 is greater than the depth DA2 of the second opening A2. Specifically, along the direction Z, the thickness of the insulating layer 102A measured from the substantially flat top surface adjacent to the first opening A1 to the bottom surface adjacent to the conductive layer 101 is 0.95 times the depth of the first opening A1 (calculated from the bottom surface of the insulating layer 102A adjacent to the conductive layer 101). Such a measurement method may be applied to the measurement of the depths of all openings of the disclosure, but the disclosure is not limited thereto. In some embodiments, the depth and/or width of the first opening A1 and the second opening A2 may be measured from the same cross-section or from different cross-sections, but the disclosure is not limited thereto.

The single-thickness insulating layer in any of the following embodiments may be changed into a plurality of thickness insulating layers as described above, which is not repeated herein.

Figure 8A:
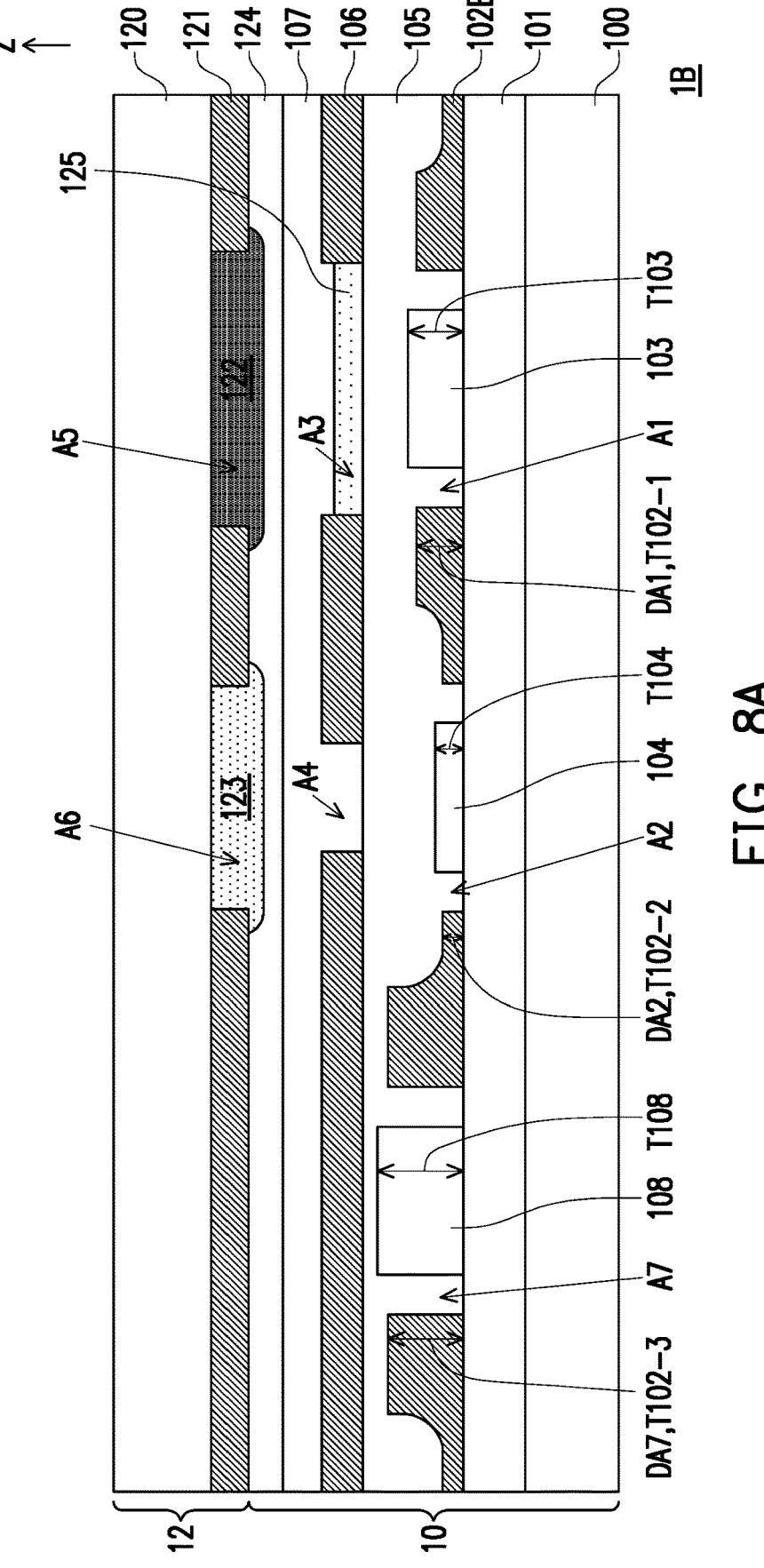

Referring to FIG. 7 and FIG. 8A, the main differences between the manufacturing method of an electronic device 1B shown in FIG. 7 and FIG. 8A and the manufacturing method of the electronic device 1 shown in FIG. 3 and FIG. 4G are described below. After the conductive layer 101 is formed (step S2), a coating film or a coating process may be used to form an entire insulating layer 102B, and then the first opening A1, the second opening A2, and a seventh opening A7 are formed via a patterning process (step S3').

In some embodiments, although not shown, the insulating layer 102B may have a single thickness. Alternatively, as shown in FIG. 8A, the insulating layer 102B may have a plurality of thicknesses. In detail, the thickness of the insulating layer 102B is designed, for example, according to the thicknesses of the first electronic element 103, the second electronic element 104, and a third electronic element 108. Taking FIG. 8A as an example, the thickness T102-1 of the insulating layer 102B at the first opening A1 is designed to be slightly less than the thickness T103 of the first electronic element 103, the thickness T102-2 of the insulating layer 102B at the second opening A2 is designed to be slightly less than the thickness T104 of the second electronic element 104, and a thickness T102-3 of the insulating layer 102B at the seventh opening A7 is designed to be slightly less than a thickness T108 of the third electronic element 108. In this way, the first electronic element 103, the second electronic element 104, and the third electronic element 108 may be transferred via a single transfer equipment or fixture.

As shown in FIG. 8A, since the thickness T108 of the third electronic element 108 is greater than the thickness T103 of the first electronic element 103, and the thickness T103 of the first electronic element 103 is greater than the thickness T104 of the second electronic element 104, the thickness T102-3 of the insulating layer 102B at the seventh opening A7 is greater than the thickness T102-1 of the insulating layer 102B at the first opening A1, and the thickness T102-1 of the insulating layer 102B at the first opening A1 is greater than the thickness T102-2 of the insulating layer 102B at the second opening A2, wherein the depth DA1 of the first opening A1 is equal to 0.95 times the thickness T102-1 of the insulating layer 102B at the first opening A1, the depth DA2 of the second opening A2 is equal to 0.95 times the thickness T102-2 of the insulating layer 102B at the second opening A2, the depth DA7 of the seventh opening A7 is equal to 0.95 times the thickness T102-3 of the insulating layer 102B at the seventh opening A7, the depth DA7 of the seventh opening A7 is greater than the depth DA1 of the first opening A1, and the depth DA1 of the first opening A1 is greater than the depth DA2 of the second opening A2.

Moreover, before the light-shielding layer 106 is formed (step S6), the third electronic element 108 is disposed in the seventh opening A7 and electrically connected to the conductive layer 101 (step S9). The third electronic element 108 may be, for example, a drive unit having the function of outputting/transmitting a drive signal, and the third electronic element 108 may be electrically connected to at least one of the first electronic element 103 and the second electronic element 104 via the conductive layer 101, but the disclosure is not limited thereto.

Although FIG. 7 shows that the first electronic element 103 is transferred onto the conductive layer 101 before the second electronic element 104 and the second electronic element 104 is transferred onto the conductive layer 101 before the third electronic element 108, the transfer sequence of the first electronic element 103, the second electronic element 104, and the third electronic element 108 may be changed according to actual needs, and is not limited to what is shown in FIG. 7. For example, based on factors such as yield or cost, electronic elements with higher distribution density or less thickness may be transferred first. Taking FIG. 8A as an example, the first electronic element 103, the second electronic element 104, and the third electronic element 108 are, for example, a light-emitting unit, a photosensitive unit, and a drive unit, respectively, and the transfer steps of various electronic elements are, for example, firstly transferring the second electronic element 104, then transferring the first electronic element 103, and lastly transferring the third electronic element 108, but the disclosure is not limited thereto. In other embodiments, although not shown, the first electronic element 103, the second electronic element 104, and the third electronic element 108 are, for example, an antenna unit, a light-emitting unit, and a drive unit, respectively, and the transfer steps of the electronic elements are, for example, firstly transferring the first electronic element 103, then transferring the second electronic element 104, and lastly transferring the third electronic element 108, but the disclosure is not limited thereto.

Since the function of the third electronic element 108 has nothing to do with light, in the patterning step of the light-shielding layer 106 (step S6), a light channel does not need to be formed corresponding to the third electronic element 108. That is, an opening corresponding to the third electronic element 108 does not need to be formed in the light-shielding layer 106. Similarly, an opening corresponding to the third electronic element 108 does not need to be formed in the light-shielding layer 121 in the second substrate 12.

After the light-shielding layer 106 having the third opening A3 and the fourth opening A4 is formed (step S6), the light converting element 125 may then be formed in the third opening A3 (step S7), and then the second substrate 12 is attached onto the first substrate 10 (step S8). In this way, the manufacture of the electronic device 1B is preliminarily completed. In the electronic device 1B, the light converting element 125 in the third opening A3 and the light converting element 122 in the fifth opening A5 may have different materials. For example, the material of the light converting element 125 may include fluorescence, phosphorescence, quantum dots, or a combination thereof, and the material of the light converting element 122 may be a light filter material, but the disclosure is not limited thereto. In other embodiments, although not shown in FIG. 8A, the electronic device 1B may include a single light converting element (e.g., the light converting element 125 or the light converting element 122). Under this architecture, the material of the light converting element may include fluorescence, phosphorescence, quantum dots, other suitable light converting materials, light filter materials (such as color resists), or a combination of the above, but the disclosure is not limited thereto.

In other embodiments, although not shown, the electronic device 1B may further include a fourth electronic element, wherein the first electronic element 103, the second electronic element 104, the third electronic element 108, and the fourth electronic element are, for example, a light-emitting unit, a photosensitive unit, a drive unit, and an antenna unit, respectively, but the disclosure is not limited thereto. Correspondingly, the insulating layer 102B may further include an opening (e.g., an eighth opening) for accommodating the fourth electronic element. The insulating layer 102B may have a single thickness or a plurality of thicknesses. For example, the transfer step of a plurality of electronic elements is to transfer the second electronic element 104, the fourth electronic element, the first electronic element 103, and the third electronic element 108 in sequence. Alternatively, the fourth electronic element, the second electronic element 104, the first electronic element 103, and the third electronic element 108 are transferred in sequence, but the disclosure is not limited thereto. Since the function of the fourth electronic element is related to light (or electromagnetic wave), the light-shielding layer 106 further includes, for example, an opening (e.g., a ninth opening) corresponding to the fourth electronic element. The ninth opening is at least partially overlapped with the eighth opening in the direction Z, and the ninth opening may be designed as a larger opening (e.g., larger than the first opening A1) to reduce the shielding of light (or electromagnetic wave) by the light-shielding layer 106. Similarly, the light-shielding layer 121 in the second substrate 12 further includes, for example, an opening (e.g., a tenth opening) corresponding to the fourth electronic element. The tenth opening is at least partially overlapped with the ninth opening in the direction Z, and the relative size relationship between the tenth opening and the seventh opening may not be limited.

Figure 8B:
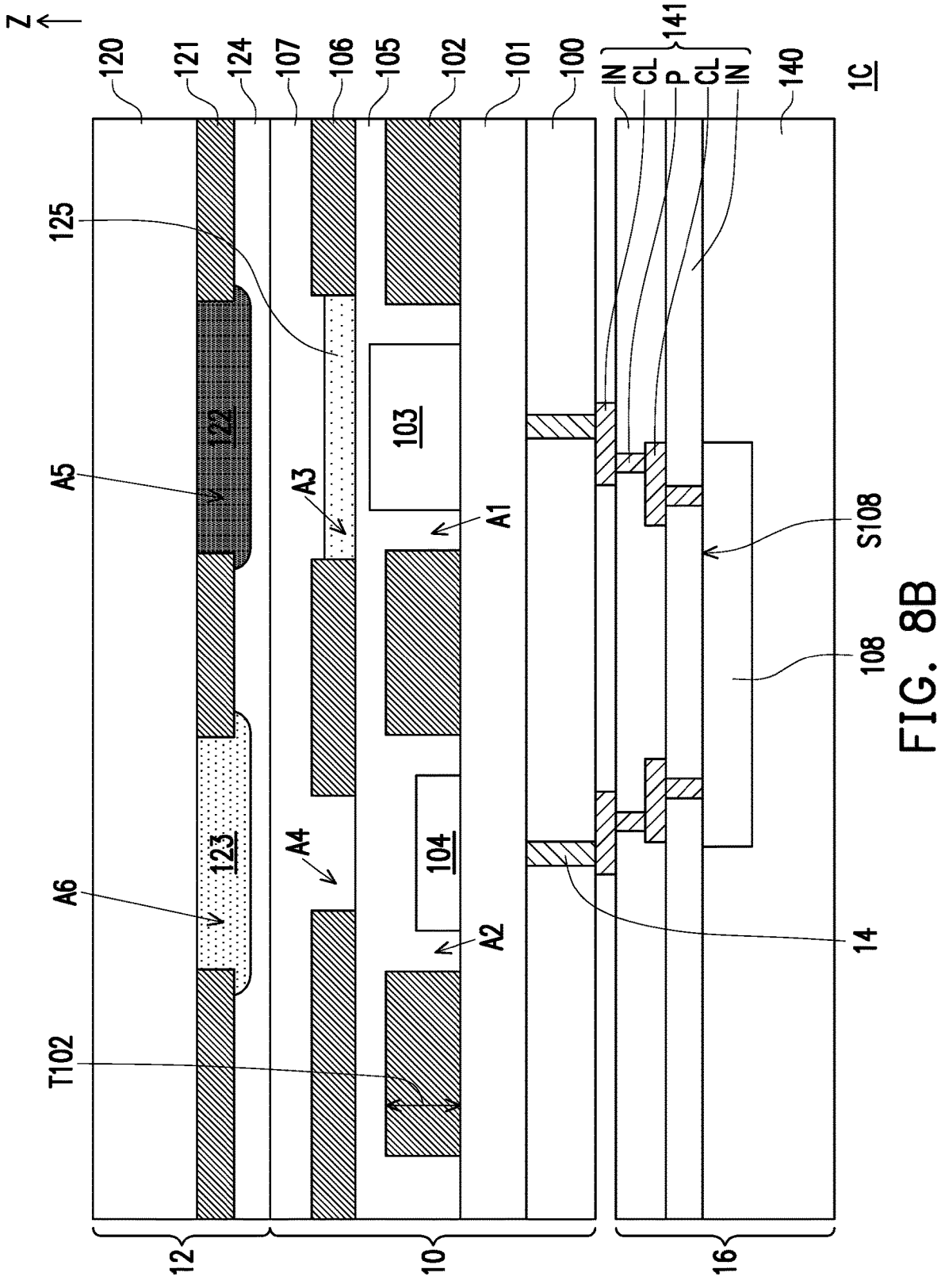

Please refer to FIG. 8B. The main differences between an electronic device 1C and the electronic device 1B of FIG. 8A are described below. The electronic device 1C also includes a plurality of connecting elements 14 and a drive unit 16. The plurality of connecting elements 14 penetrate through the substrate 100 and are electrically connected to the drive unit 16. The drive unit 16 may include a controller (e.g., the third electronic element 108) and a redistribution layer structure 141. The redistribution layer structure 141 is disposed on the third electronic element 108 and electrically connected to the third electronic element 108. The redistribution layer structure 141 includes, for example, a plurality of insulating layers IN, a plurality of conductive layers CL, and a plurality of connecting elements P. The plurality of insulating layers IN and the plurality of conductive layers CL are alternately disposed on the third electronic element 108. The conductive layer CL may be formed by first forming the conductive layer and then performing a patterning process. Each of the connecting elements P penetrates one or a plurality of insulating layers IN to electrically connect two corresponding conductive layers CL. The plurality of connecting elements 14 penetrating the substrate 100, for example, electrically connect the conductive layer 101 to the conductive layer CL closest to the substrate 100. The material of the insulating layer IN includes, for example, silicon oxide or silicon nitride, but the disclosure is not limited thereto. The material of the conductive layer CL and the connecting element 14 includes, for example, metal, alloy, or a combination thereof, but the disclosure is not limited thereto. The material of the conductive layer CL and the connecting element 14 may be the same or different.

In some embodiments, the drive unit 16 may also include an encapsulation layer 140 to protect the controller (e.g., the third electronic element 108). For example, the encapsulation layer 140 surrounds the third electronic element 108 and exposes a surface S108 of the third electronic element 108 facing the substrate 100. The material of the encapsulation layer 140 includes, but not limited to, silicon oxide, silicon nitride, or acrylic-based polymer material, for example.

In some embodiments, after the second substrate 12 is attached onto the first substrate 10, the plurality of connecting elements 14 penetrating the substrate 100 are formed in the substrate 100, and then the drive unit 16 is joined to the plurality of connecting elements 14. Or, the plurality of connecting elements 14 may be manufactured in the step of forming the conductive layer 101, and then after the second substrate 12 is attached onto the first substrate 10, the drive unit 16 may be joined with the plurality of connecting elements 14.

By disposing the third electronic element 108 in the drive unit 16, the seventh opening A7 does not need to be formed in the insulating layer 102. Moreover, the insulating layer 102 may have a single thickness (e.g., the thickness T102), but the disclosure is not limited thereto. In other embodiments, the insulating layer 102 may be replaced with the insulating layer 102A having a plurality of thicknesses as shown in FIG. 6.

Figure 8C:
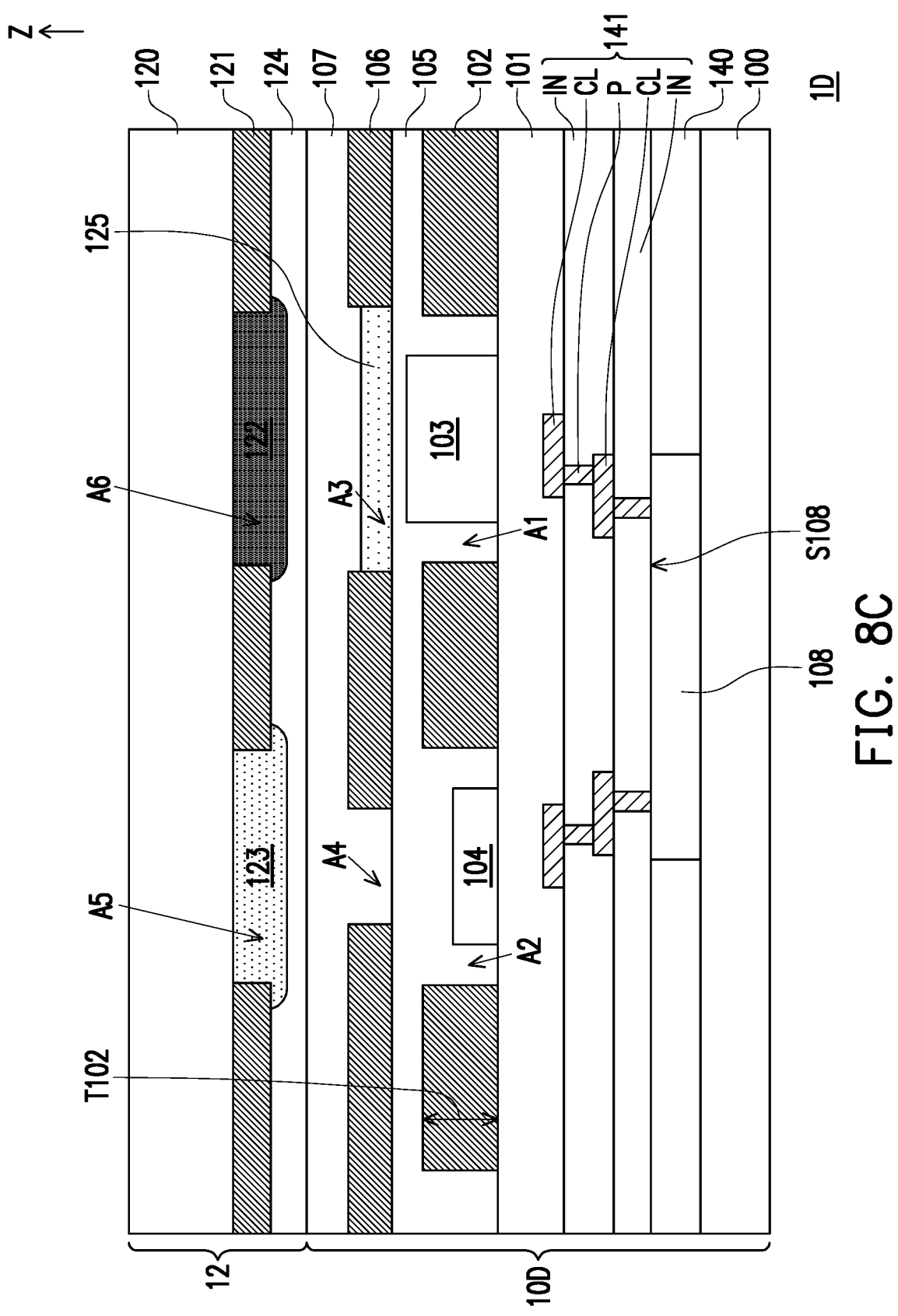

Please refer to FIG. 8C. The main differences between an electronic device 1D and the electronic device 1C of FIG. 8B are described below. In the electronic device 1D, the third electronic element 108, the encapsulation layer 140, and the redistribution layer structure 141 are disposed in the first substrate 10D. Specifically, the third electronic element 108 and the encapsulation layer 140 are disposed on the substrate 100, and the redistribution layer structure 141 is disposed between the third electronic element 108 (and the encapsulation layer 140) and the conductive layer 101. Via the above design, the electronic device 1D may omit the plurality of connecting elements 14.

Figure 10:
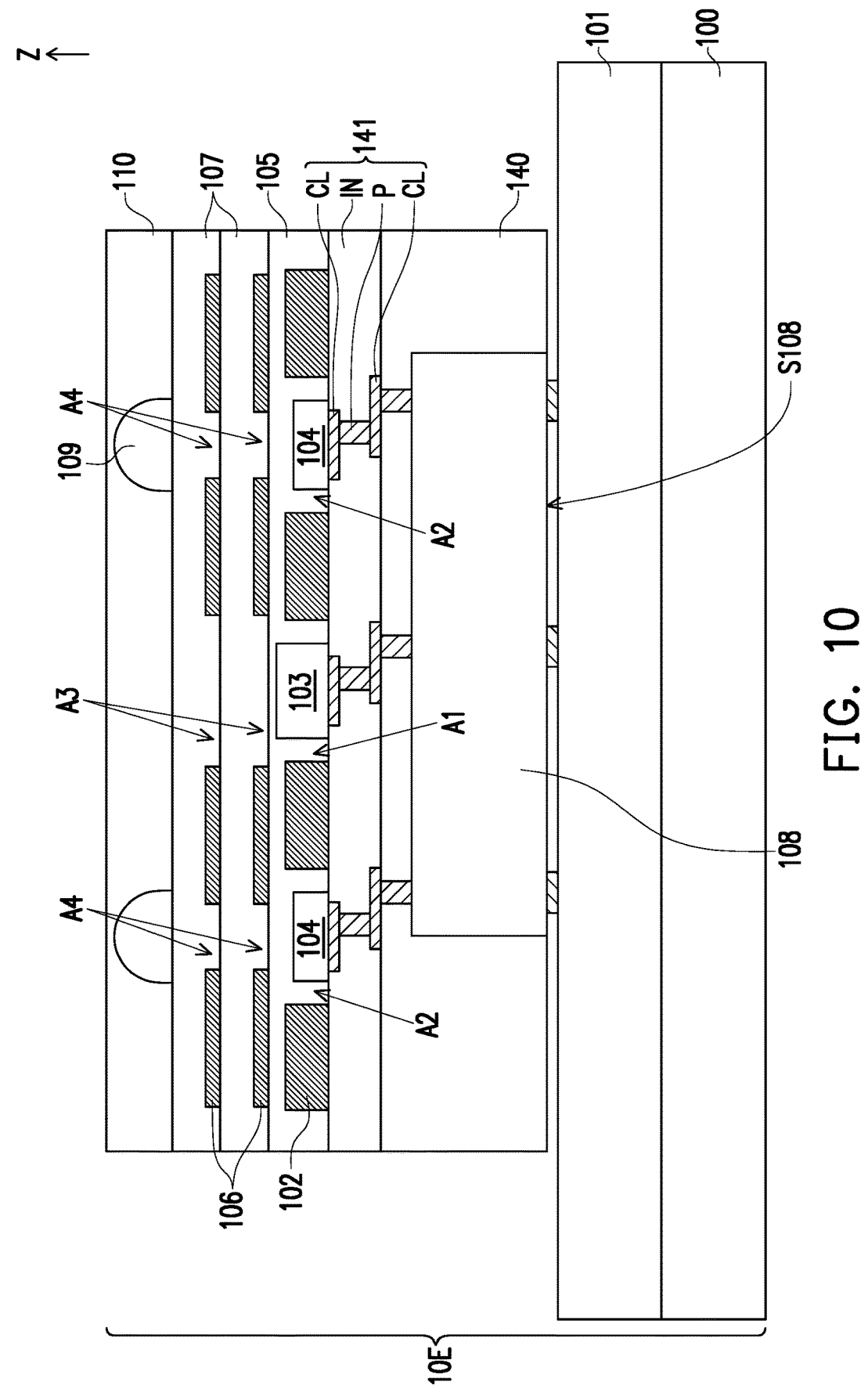

Referring to FIG. 9 and FIG. 10, the main differences between the manufacturing method of an electronic device IE shown in FIG. 9 and FIG. 10 and the manufacturing method of the electronic device 1D shown in FIG. 8C are described below. Moreover, FIG. 10 omits the second substrate 12 (refer to FIG. 8C) and the insulating layer 102 (refer to FIG. 8C), so please refer to FIG. 8C for the description of the second substrate 12 and the insulating layer 102 below.

For example, the manufacturing method of the electronic device IE includes the following steps. The third electronic element 108 is provided (step S10). A conductive layer is formed on the third electronic element 108, for example, the redistribution layer structure 141 is formed on the third electronic element 108 (step S11). The insulating layer 102 is formed on the conductive layer (e.g., the redistribution layer structure 141), and the insulating layer 102 is patterned to form the first opening A1 and the second opening A2 (step S3). The first electronic element 103 is disposed in the first opening A1 and electrically connected to the conductive layer (e.g., the redistribution layer structure 141) (step S4). The second electronic element 104 is disposed in the second opening A2 and electrically connected to the conductive layer (e.g., the redistribution layer structure 141) (step S5). The light-shielding layer 106 is formed on the insulating layer 102, and the light-shielding layer 106 is patterned to form the third opening A3 and the fourth opening A4 (step S6). An optical structure 109 is formed (step S12). An encapsulation layer 110 is formed on the optical structure 109 (step S13). The third electronic element 108 is bonded to the conductive layer 101 on the substrate 100 (step S14). The second substrate 12 is attached (step S8). However, the disclosure is not limited thereto.

In detail, for step S10, the third electronic element 108 may be provided. Then, the encapsulation layer 140 may be formed on the third electronic element 108. The encapsulation layer 140 surrounds the third electronic element 108 and exposes the surface S108 of the third electronic element 108 facing the substrate 100.

For step S11, a conductive layer (e.g., the redistribution layer structure 141) may be formed on the encapsulation layer 140, wherein the connecting elements P may penetrate the encapsulation layer 140 to electrically connect the third electronic element 108 to the corresponding conductive layer CL.

For steps S3 to S5, please refer to the above description, which are not repeated herein.

For step S6, one light-shielding layer 106 and one insulating layer 107, or a plurality of light-shielding layers 106 and a plurality of insulating layers 107 may be alternately formed on the insulating layer 102 and the insulating layer 105. FIG. 10 schematically illustrates two light-shielding layers 106 and two insulating layers 107, but the respective numbers of the light-shielding layers 106 and the insulating layers 107 are not limited thereto. For example, the numbers of the light-shielding layers 106 and the insulating layers 107 may be greater than or equal to three. In addition, the third openings A3 (or the fourth openings A4) of different layers may have the same or different sizes.

For step S12, the optical structure 109 is formed on the insulating layer 107. For example, the optical structure 109 is disposed corresponding to the photosensitive unit (e.g., the second electronic element 104). That is, the optical structure 109 in the direction Z is at least partially overlapped with the photosensitive unit (e.g., the second electronic element 104). The light incident toward the second electronic element 104 may be collected using the optical structure 109 to help to improve the amount of light received by the second electronic element 104 or the recognition degree of the second electronic element 104. The shape of the optical structure 109 is, for example, a hemisphere, and the hemisphere generally refers to a non-complete sphere, and is not limited to half of a sphere. The material of the optical structure 109 includes, for example, but not limited to, a polymer material. The refractive index of the optical structure 109 is greater than the refractive indices of the encapsulation layer 110, the insulating layer 107, and the insulating layer 105.

For step S13, the encapsulation layer 110 is formed on the optical structure 109 and the insulating layer 107. For the material of the encapsulation layer 110, reference may be made to the material of the encapsulation layer 140, which is not repeated herein.

For step S14, the substrate 100 may be provided first (step S1 shown in FIG. 7), then the conductive layer 101 may be formed on the substrate 100 (step S2 shown in FIG. 7), and then the third electronic element 108 is bonded to the conductive layer 101 on the substrate 100.

For step S8, please refer to the above description, which is not repeated herein.

Figures 11A, 11B:
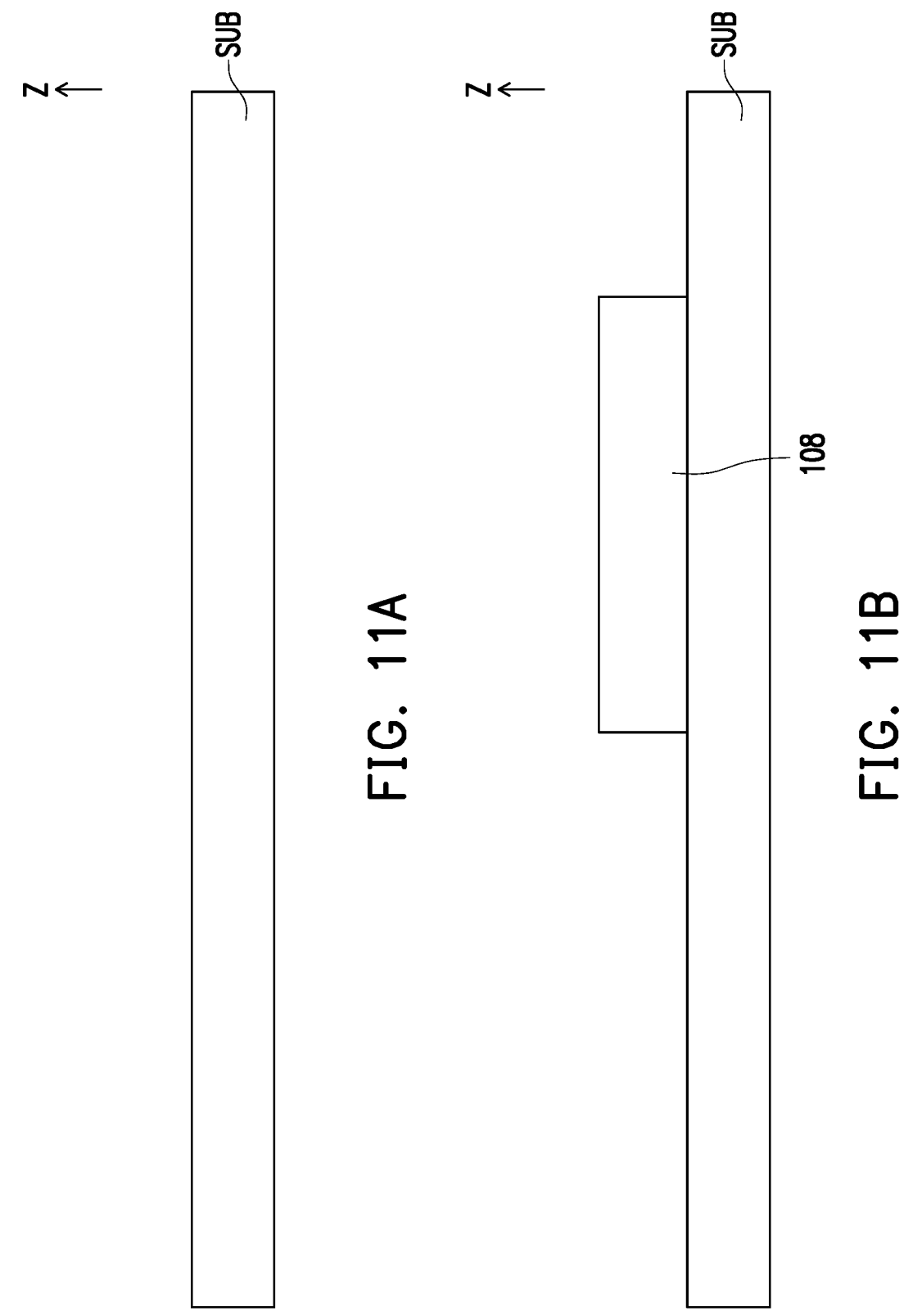

FIG. 11A to FIG. 13C illustrate a manufacturing process of an electronic device 1F according to an embodiment of the disclosure. Referring to FIG. 11A, a substrate SUB is provided. The material of the substrate SUB may be the material of the substrate 100. Alternatively, the material of the substrate SUB may include a semiconductor material, for example, a silicon wafer, as the substrate SUB, but the disclosure is not limited thereto.

Referring to FIG. 11B, the third electronic element 108 is formed on the substrate SUB. For example, the third electronic element 108 may be transferred onto the substrate SUB via a transfer equipment or fixture, but the disclosure is not limited thereto.

Figures 11C, 11D:
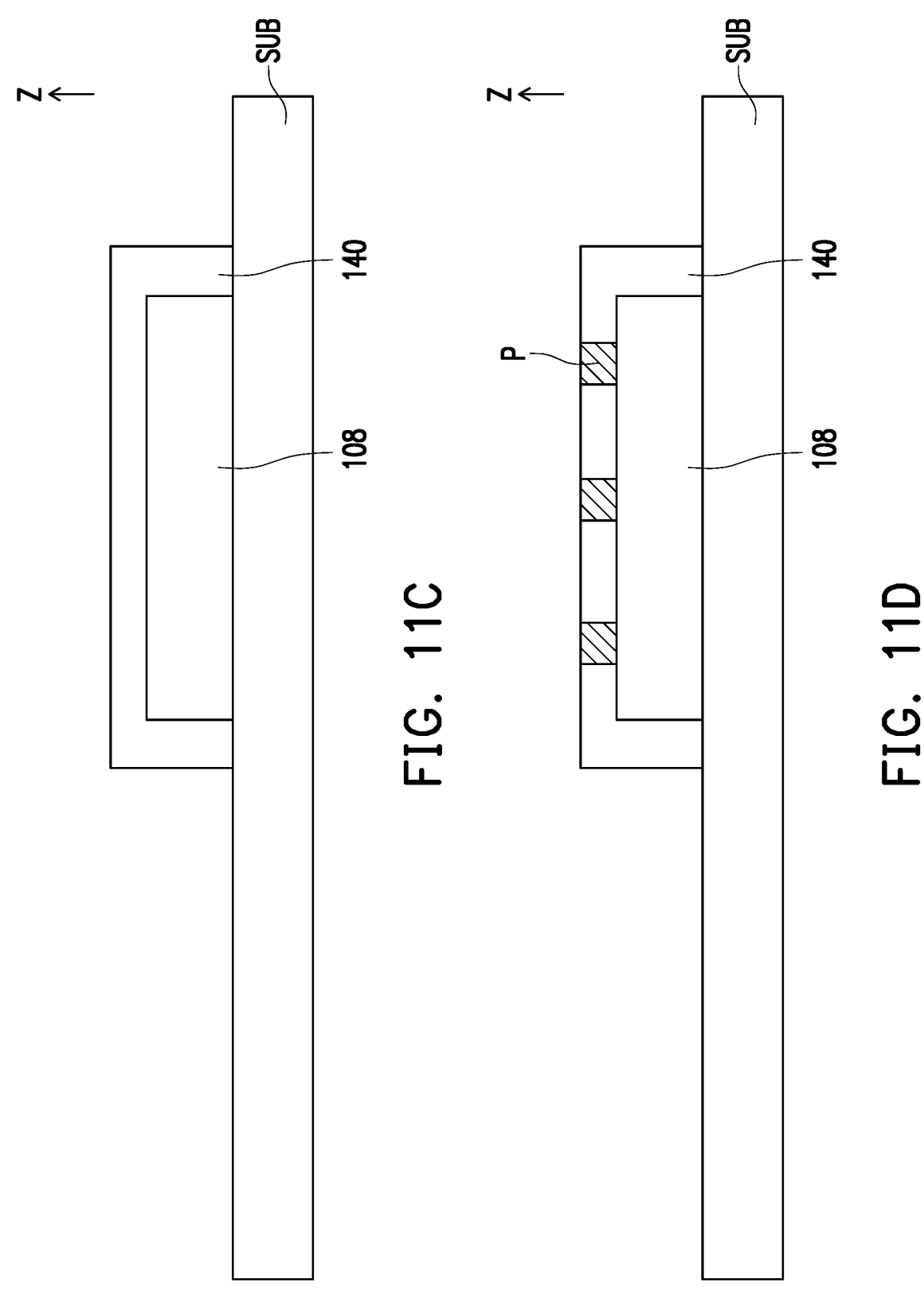

Referring to FIG. 11C, the encapsulation layer 140 is formed on the substrate SUB and the third electronic element 108. For the material of the encapsulation layer 140, please refer to the above, which is not repeated herein.

Referring to FIG. 11D, the plurality of connecting elements P are formed in the encapsulation layer 140 on the third electronic element 108, and the plurality of connecting elements P penetrate through the encapsulation layer 140 and are electrically connected to the third electronic element 108.

Figure 11E:
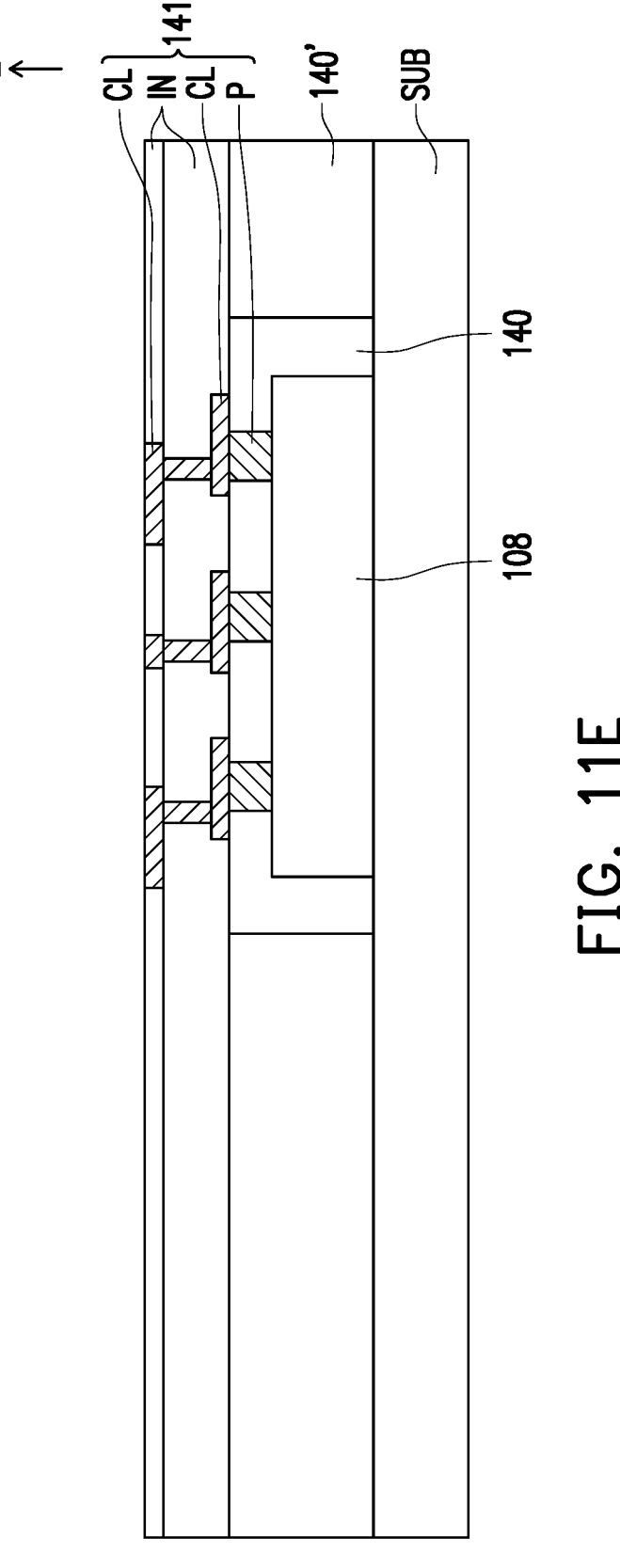

Referring to FIG. 11E, an encapsulation layer 140' is formed in a region of the substrate SUB where the encapsulation layer 140 is not disposed. The encapsulation layer 140' is aligned with the encapsulation layer 140, for example. For the material of the encapsulation layer 140', reference may be made to the material of the encapsulation layer 140, which is not repeated herein. Next, the redistribution layer structure 141 is formed on the encapsulation layer 140 and the encapsulation layer 140'.

Figure 11F:
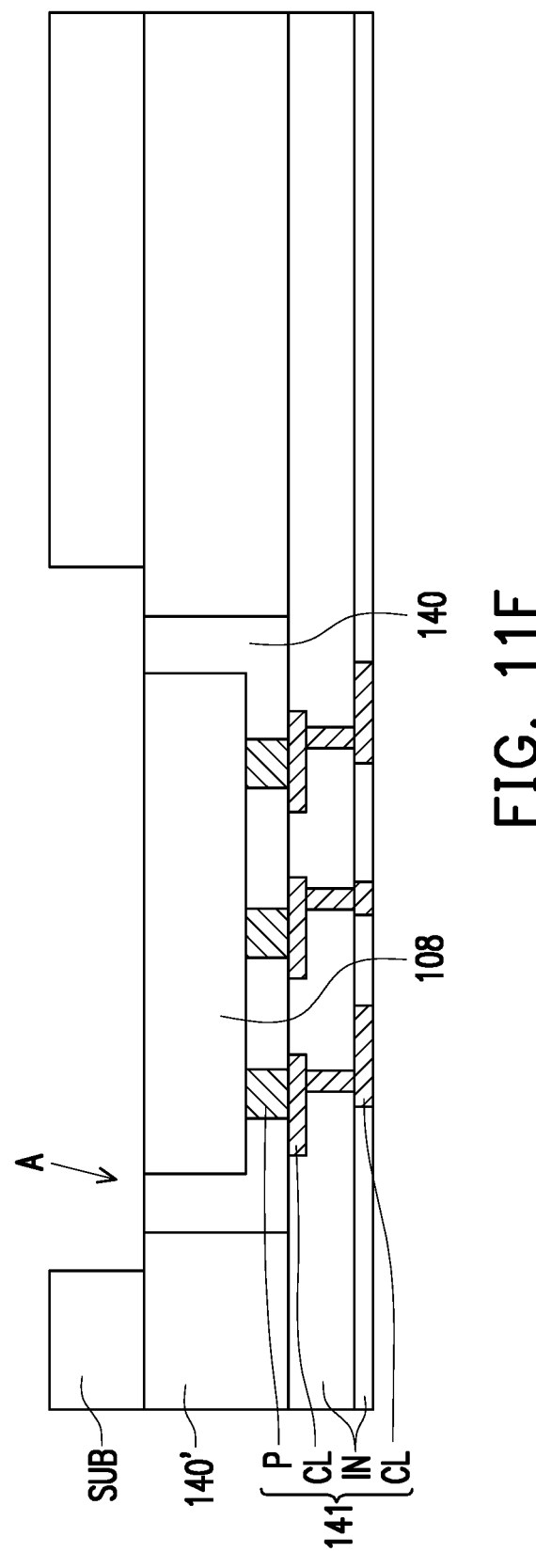

Referring to FIG. 11F, the substrate SUB is turned over, and the opening A is formed in the substrate SUB. The opening A may expose at least the third electronic element 108, the encapsulation layer 140, and a portion of the encapsulation layer 140', but the disclosure is not limited thereto.

Figure 11G:
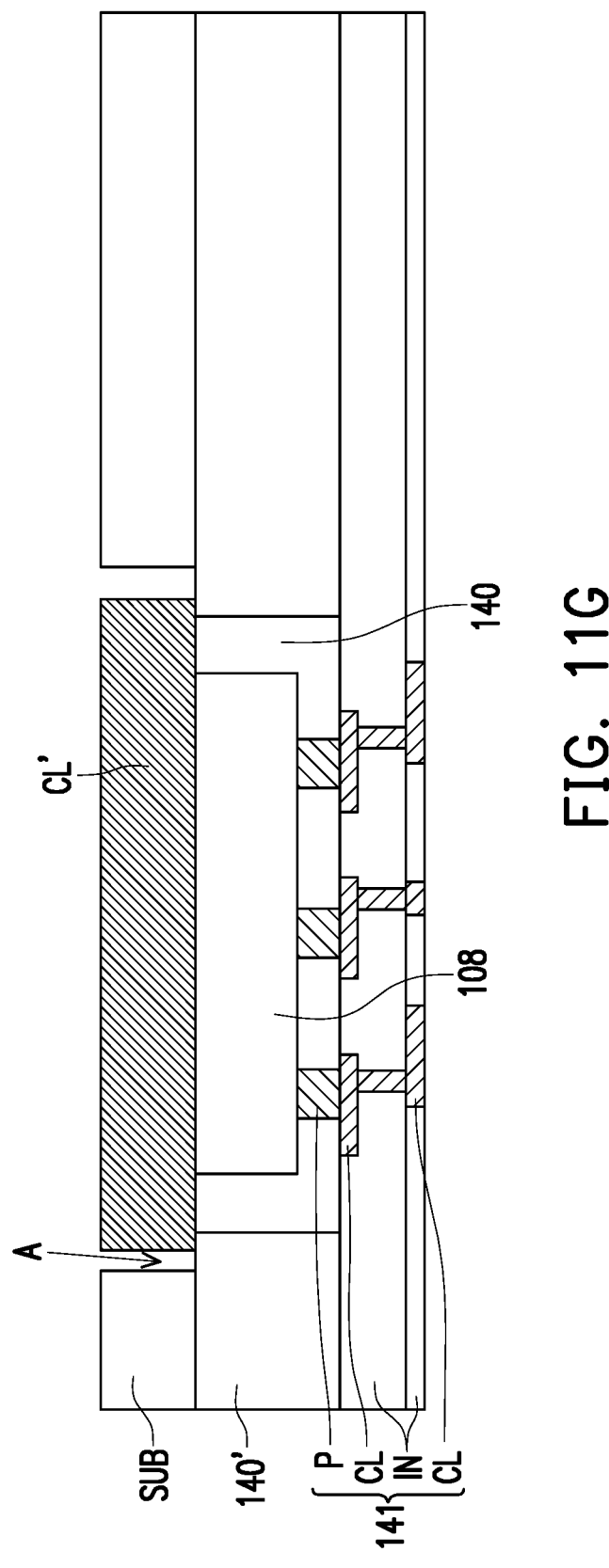

Referring to FIG. 11G, a conductive layer CL' is formed in the opening A. The conductive layer CL' is electrically connected to the third electronic element 108. For the material of the conductive layer CL', reference may be made to the material of the conductive layer CL, which is not repeated herein.

Figure 11H:
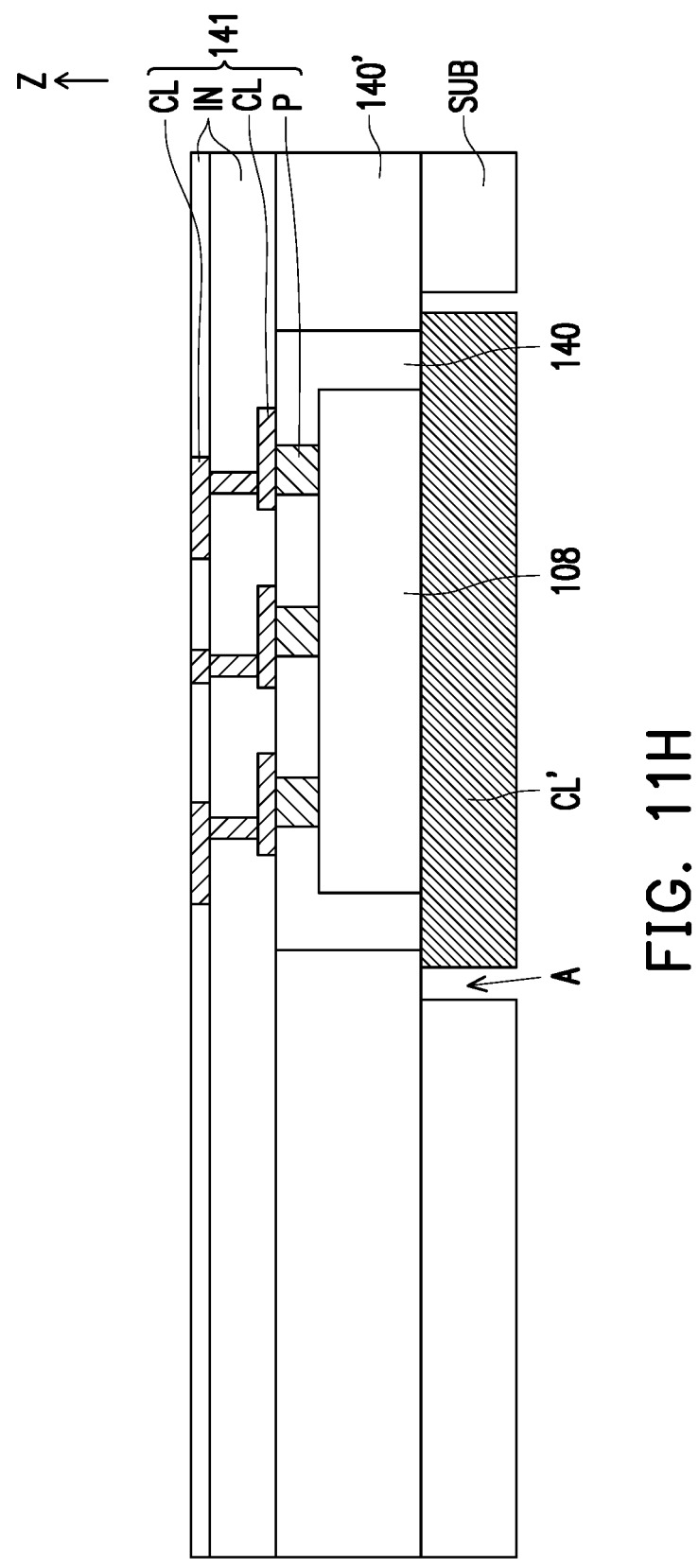

Referring to FIG. 11H, the substrate SUB is turned over again. After the steps shown in FIG. 11H are completed, the manufacture of the drive module is preliminarily completed.

Figure 12A:
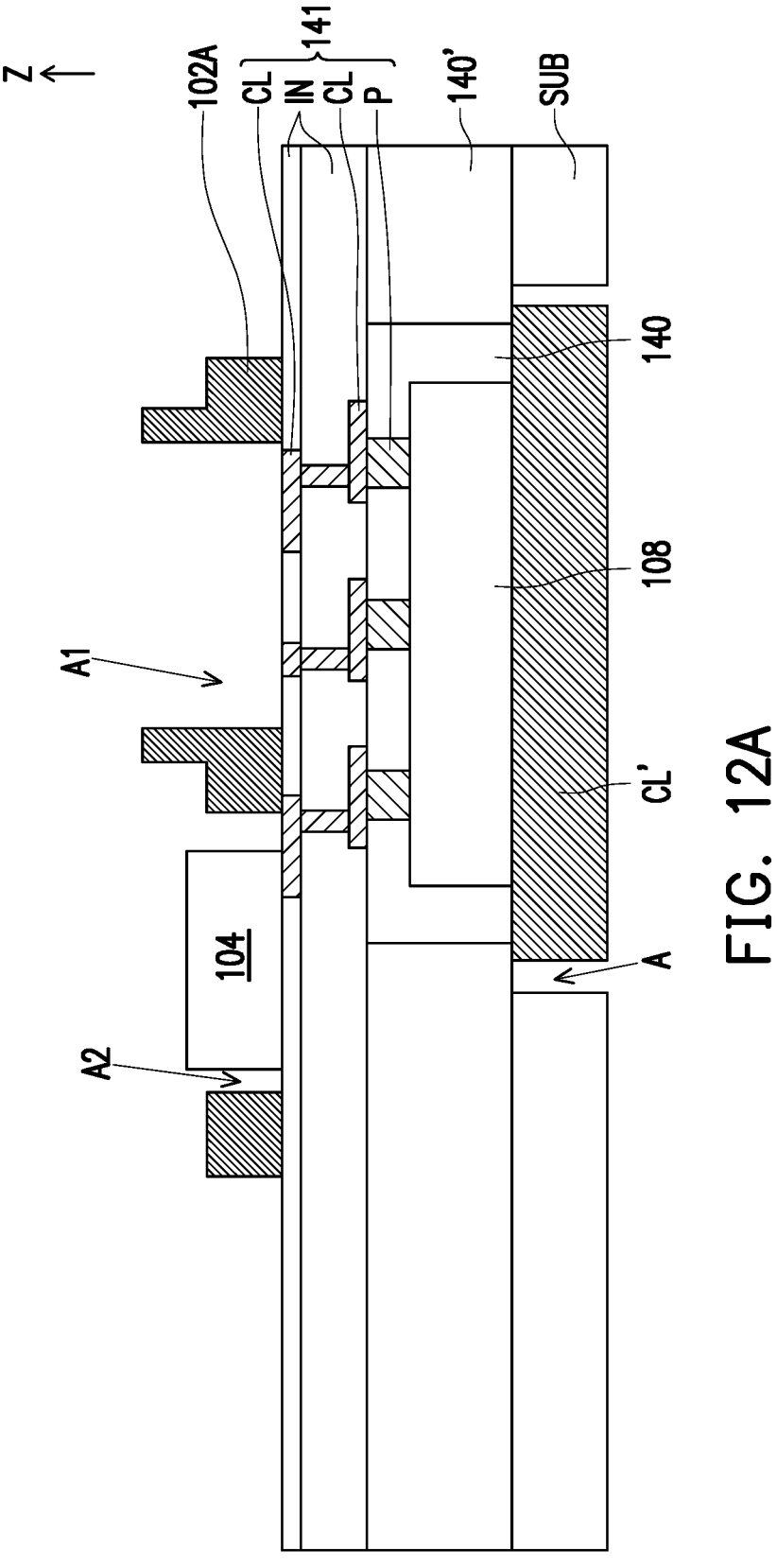

Referring to FIG. 12A, the insulating layer 102A is formed on the redistribution layer structure 141. Next, the second electronic element 104 is transferred into the second opening A2, and the second electronic element 104 is electrically connected to the redistribution layer structure 141. In other embodiments, although not shown here, the insulating layer 102A may be replaced with an insulating layer having a single thickness.

Figure 12B:
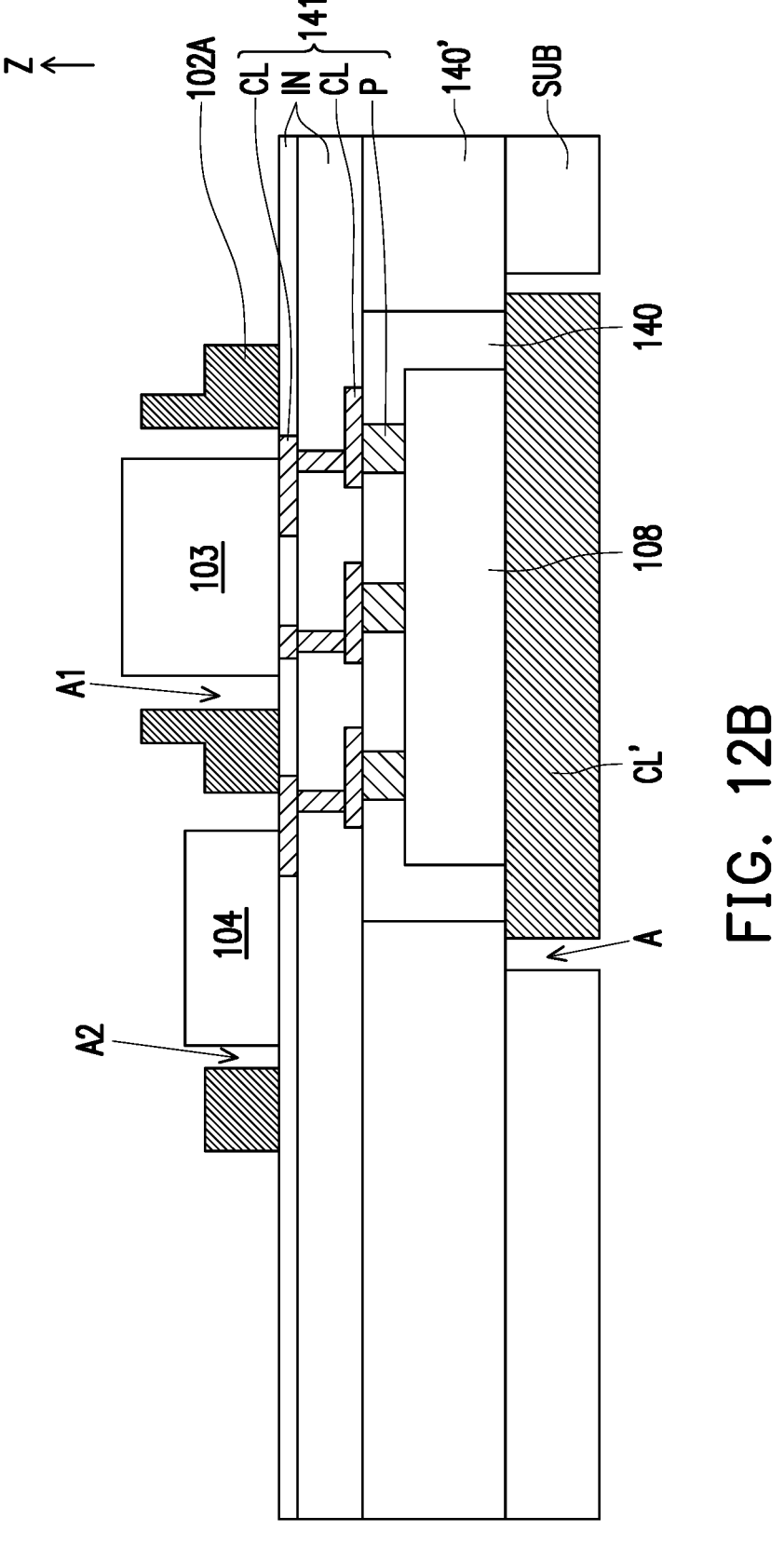

Referring to FIG. 12B, the first electronic element 103 is transferred into the first opening A1, and the first electronic element 103 is electrically connected to the redistribution layer structure 141.

Figure 12C:
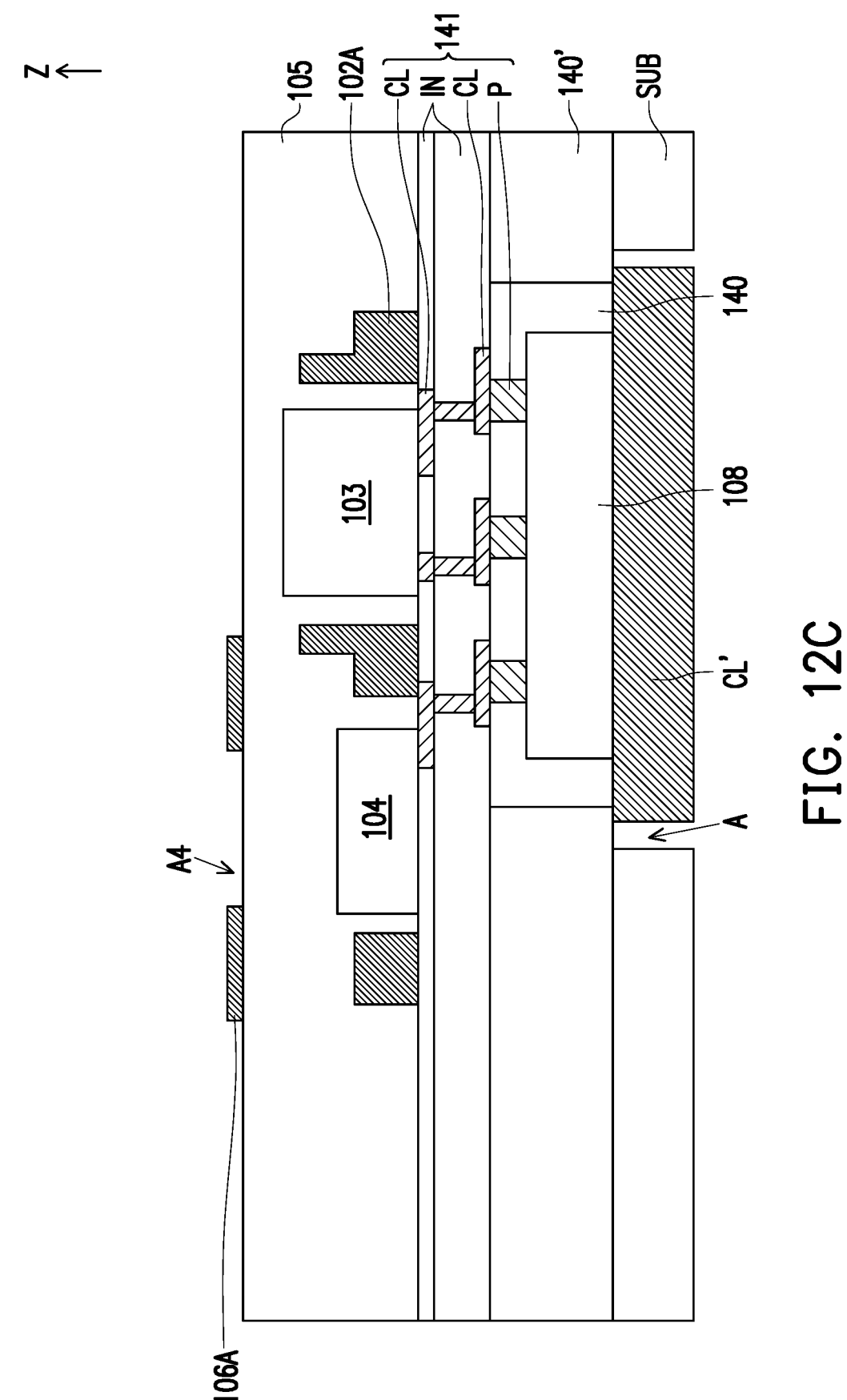

Referring to FIG. 12C, the insulating layer 105 and a light-shielding layer 106A are sequentially formed. The light-shielding layer 106A has the fourth opening A4, and the light-shielding layer 106A does not cover the first electronic element 103. For the material of the light-shielding layer 106A, reference may be made to the material of the light-shielding layer 106, which is not repeated herein.

Figure 12D:
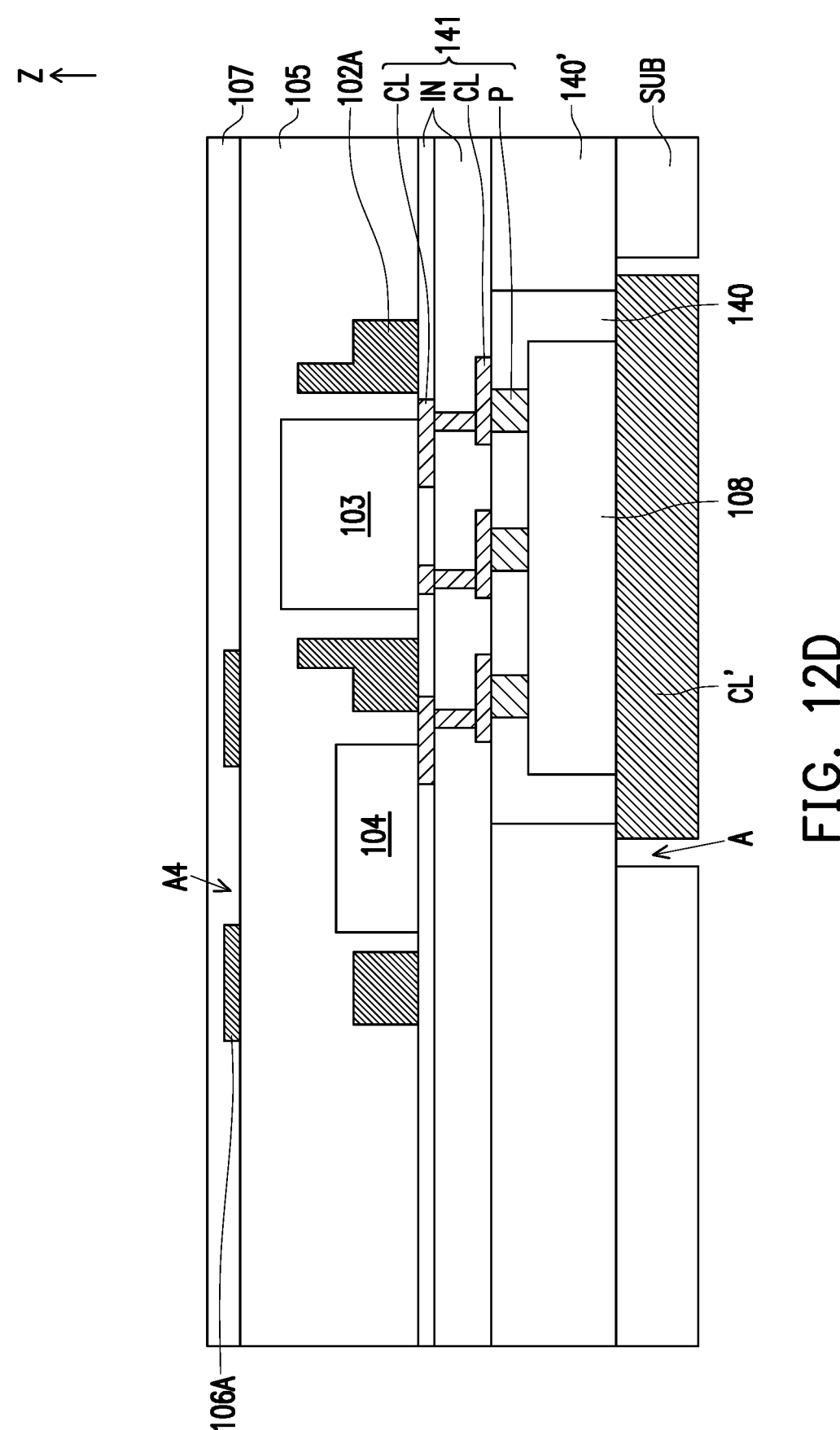

Referring to FIG. 12D, the insulating layer 107 is formed on the light-shielding layer 106A and the insulating layer 105.

Figure 12E:
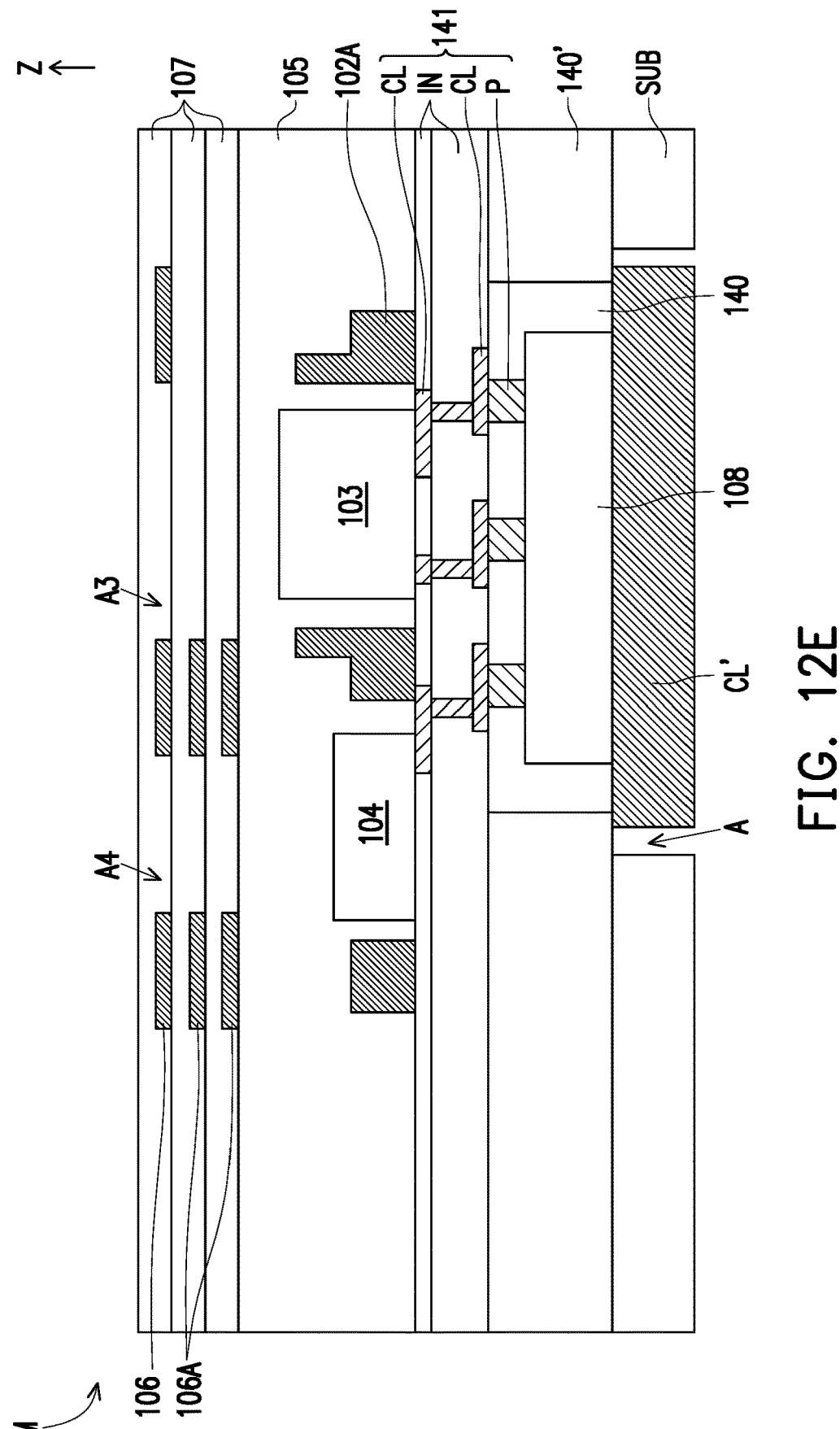

Referring to FIG. 12E, another light-shielding layer 106A, another insulating layer 107, the light-shielding layer 106 having the third opening A3 and the fourth opening A4, and yet another insulating layer 107 are sequentially formed on the insulating layer 107. By disposing a light-shielding layer (including the light-shielding layer 106A and the light-shielding layer 106) having the fourth opening A4 above the second electronic element 104, the light incident toward the second electronic element 104 (e.g., the photo-sensitive unit) may be collimated to reduce stray light or improve recognition. Moreover, by disposing the light-shielding layer 106 having the third opening A3 above the first electronic element 103, light mixing or light interference to the first electronic element 103 may be reduced. After the steps shown in FIG. 12E are completed, the manufacture of the optical module M is preliminarily completed. In some embodiments, although not shown, the optical module M may further include the optical structure 109 and the encapsulation layer 110 as shown in FIG. 10, but the disclosure is not limited thereto.

Figure 13A:
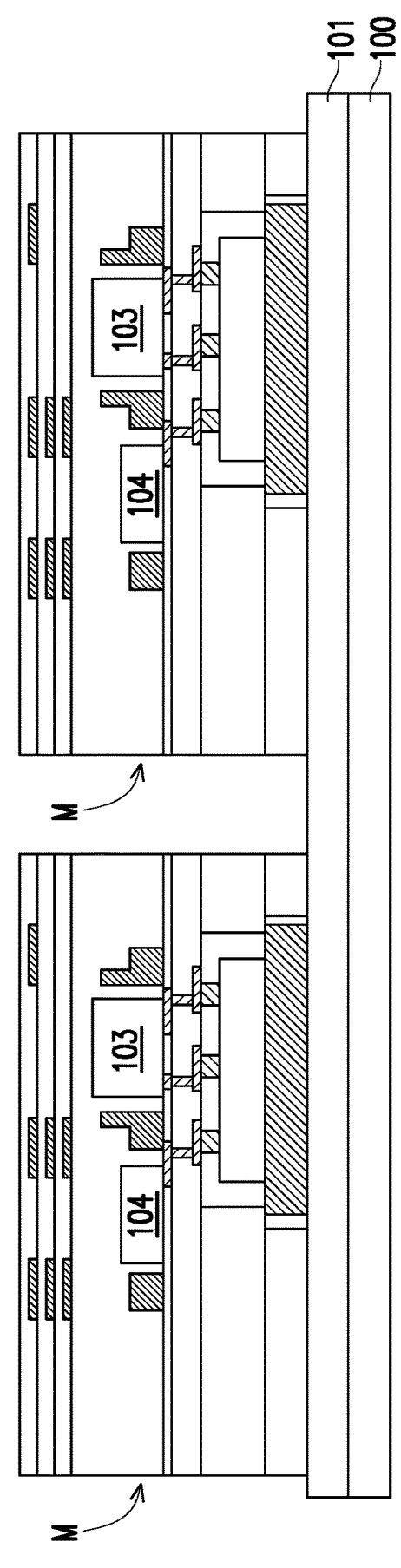

Referring to FIG. 13A, the substrate 100 is provided, and the conductive layer 101 is formed on the substrate 100. Next, the optical module M is transferred onto the conductive layer 101 and electrically connected to the conductive layer 101. In some implementations, as shown in FIG. 13A, a plurality of (e.g., two) optical modules M may be transferred onto the conductive layer 101, but the disclosure is not limited thereto.

Figure 13B:
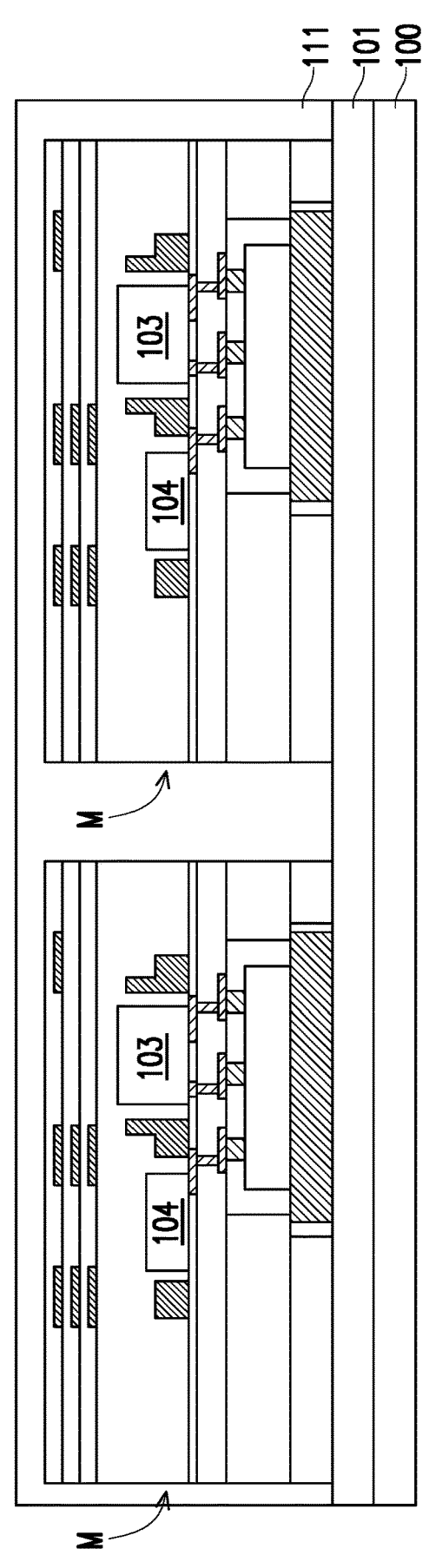

Referring to FIG. 13B, an encapsulation layer 111 is formed on the plurality of optical modules M and the conductive layer 101. For the material of the encapsulation layer 111, reference may be made to the material of the encapsulation layer 140, which is not repeated herein.

Figure 13C:
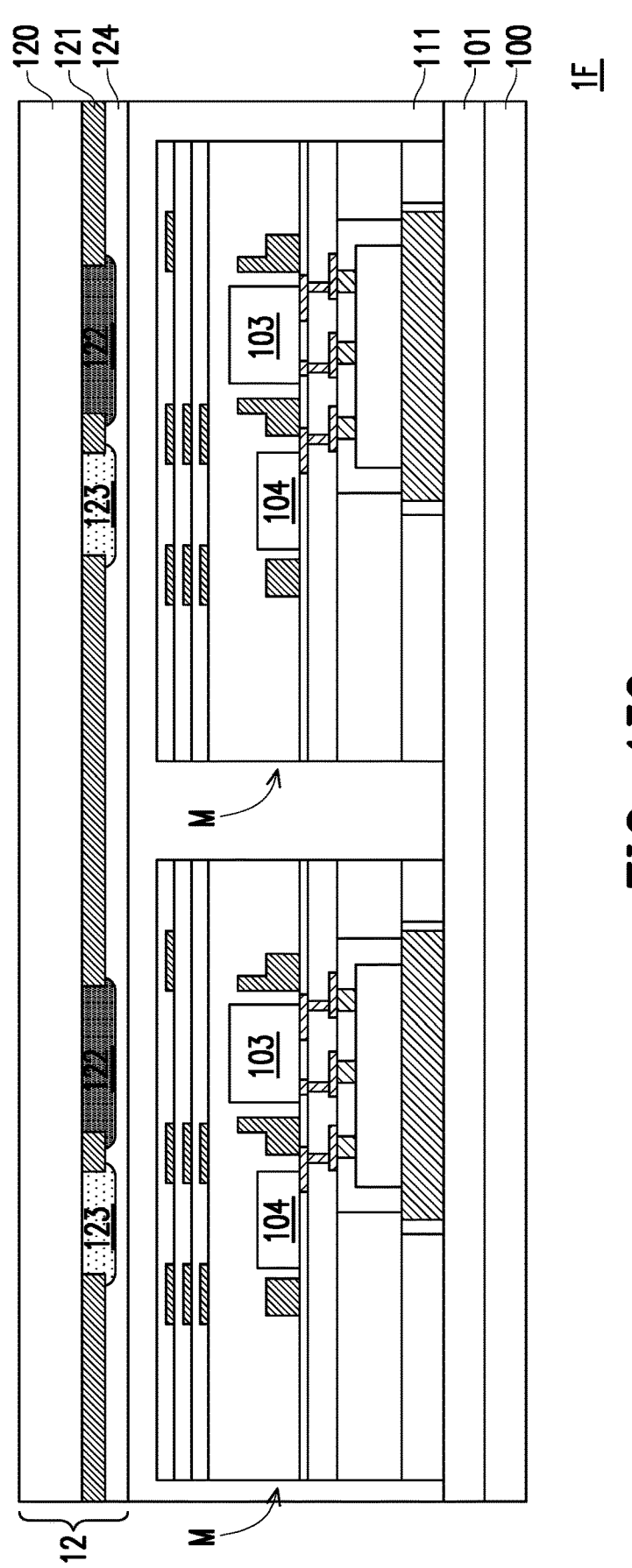

Referring to FIG. 13C, the second substrate 12 is attached onto the encapsulation layer 111. In this way, the manufacture of the electronic device 1F is preliminarily completed.

FIG. 14A to FIG. 15E illustrate a manufacturing process of an electronic device 1G according to an embodiment of the disclosure, wherein the steps shown in FIG. 14A to FIG. 14E are similar to the steps shown in FIG. 11A to FIG. 11E, so please refer to the related content above which is not repeated herein.

Figures 14A, 14B:
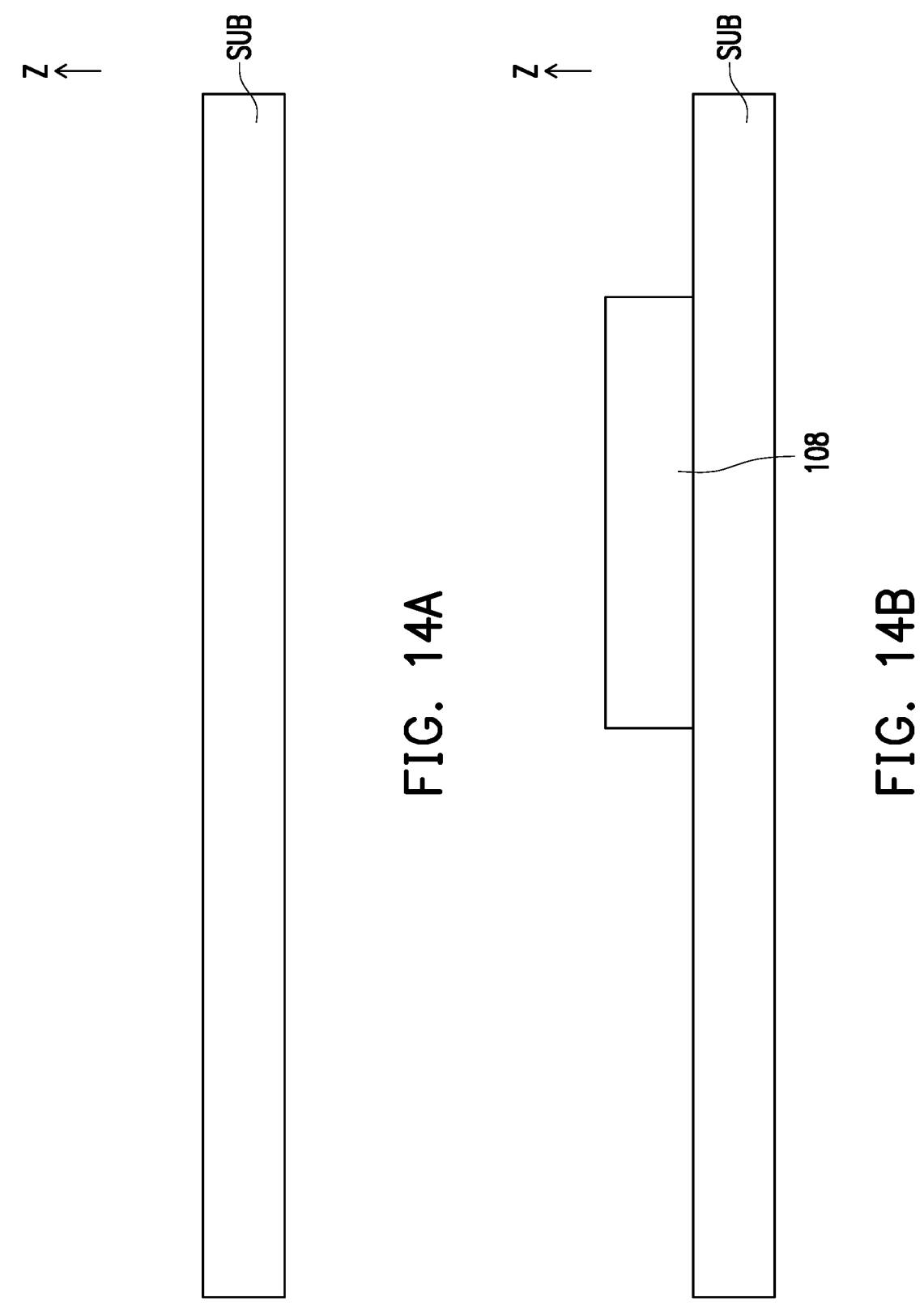
Figures 14C, 14D:
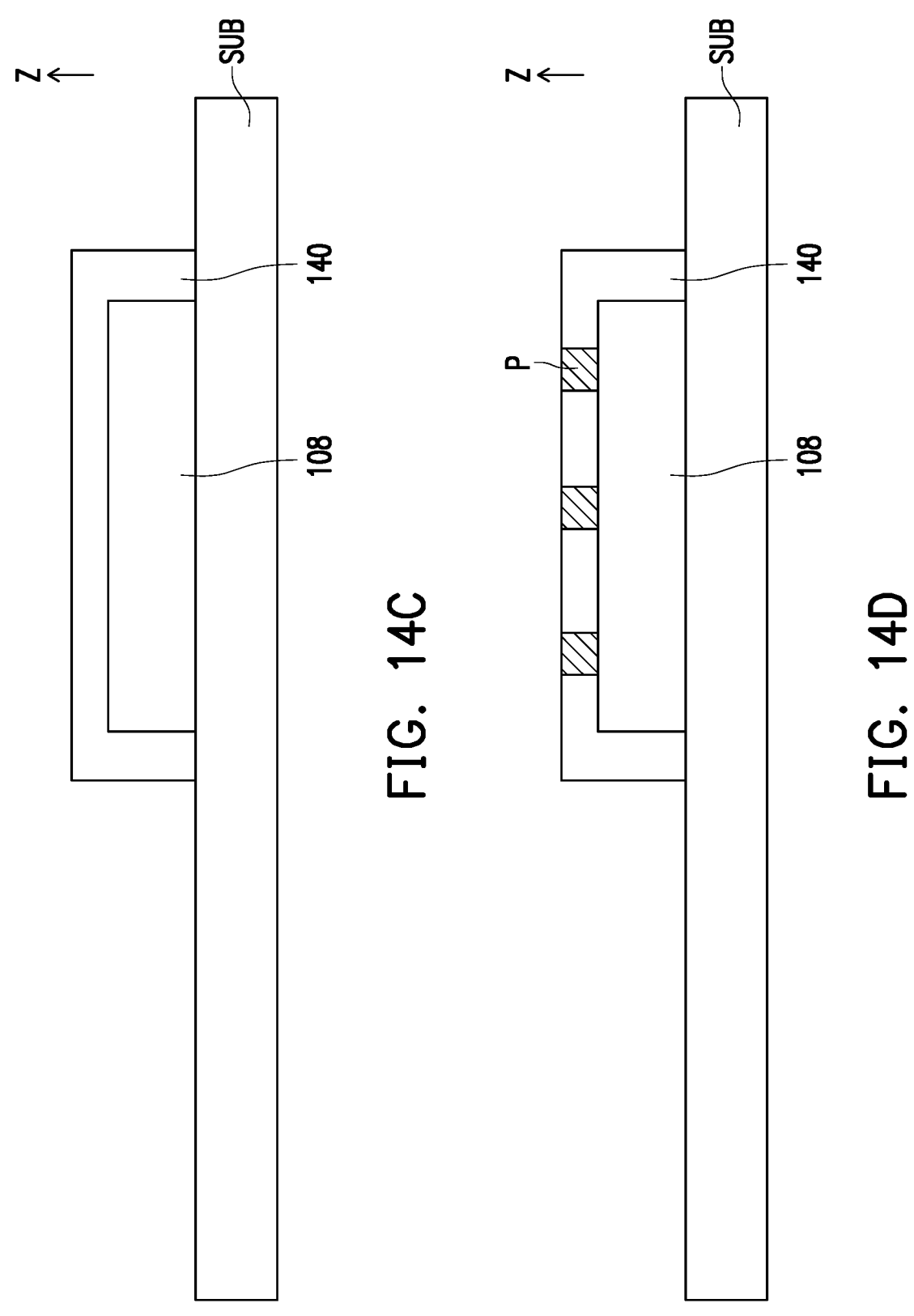
Figure 14E:
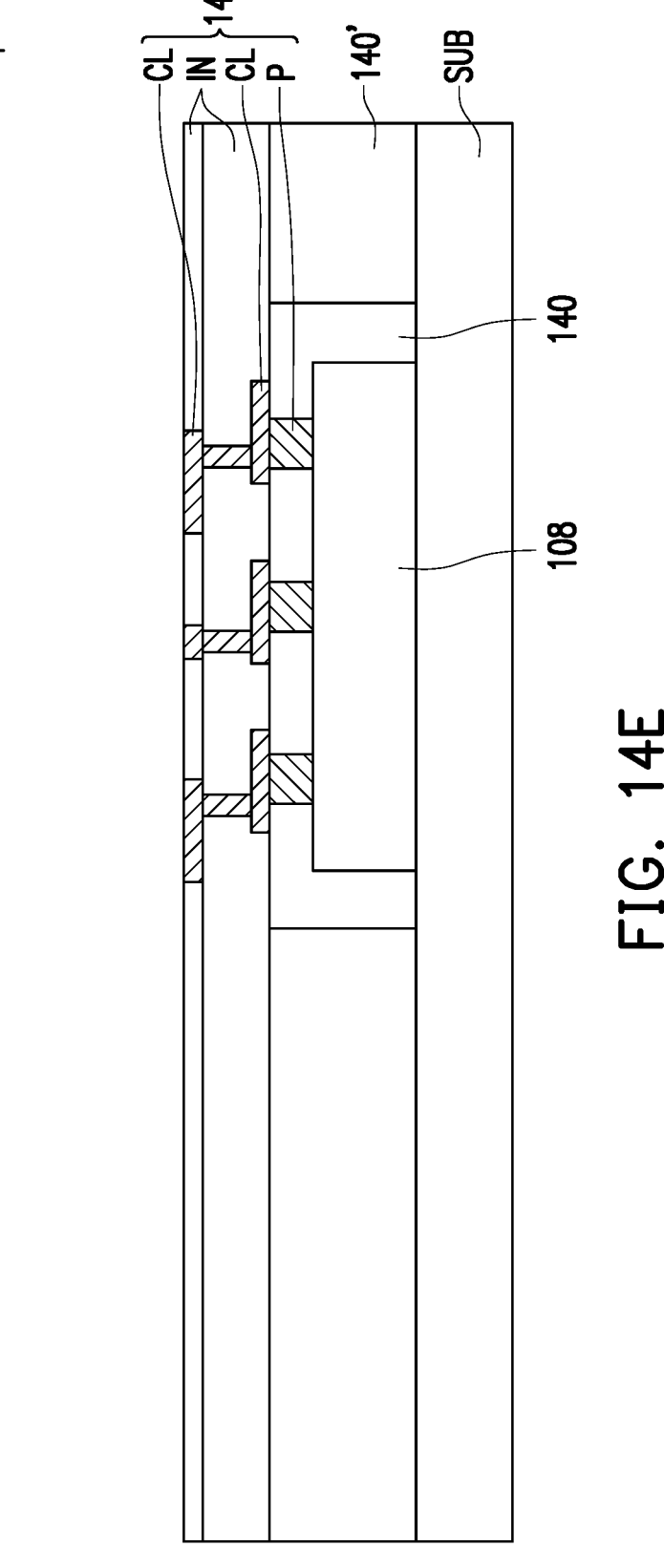
Figure 14F:
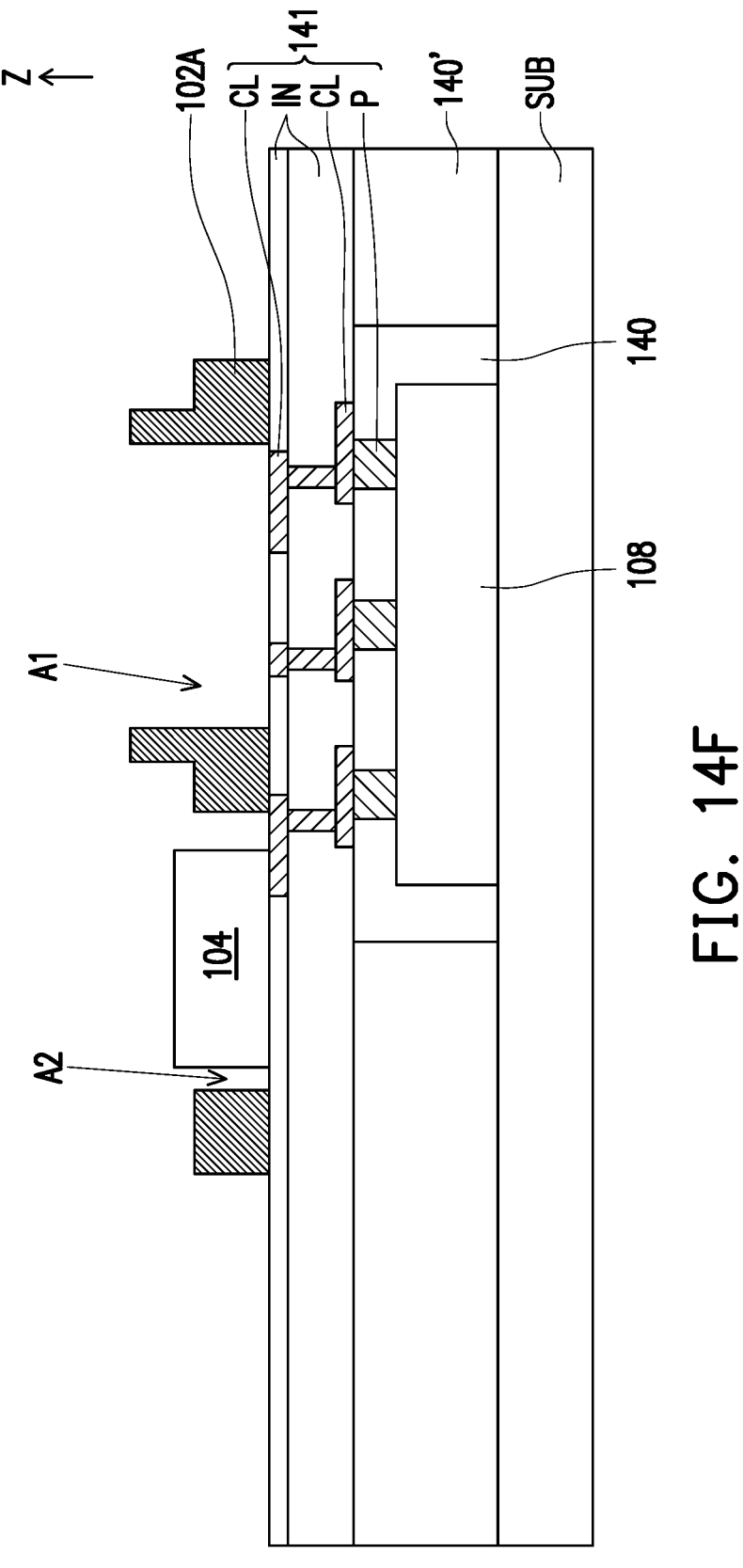

Referring to FIG. 14F, the insulating layer 102A is formed on the redistribution layer structure 141. Next, the second electronic element 104 is transferred into the second opening A2, and the second electronic element 104 is electrically connected to the redistribution layer structure 141. In other embodiments, although not shown here, the insulating layer 102A may be replaced with an insulating layer having a single thickness.

Figure 14G:
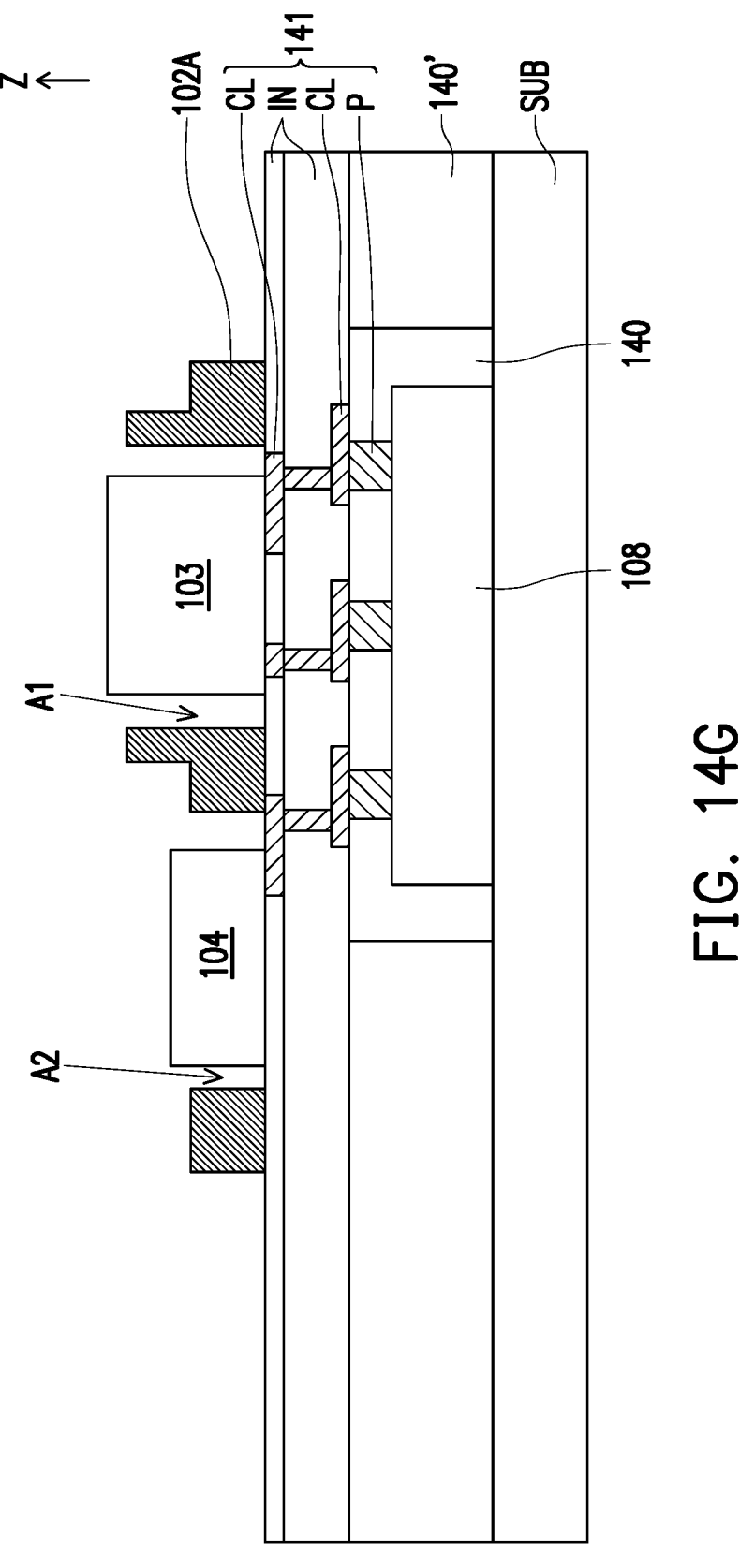

Referring to FIG. 12B, the first electronic element 103 is transferred into the first opening A1, and the first electronic element 103 is electrically connected to the redistribution layer structure 141. The steps shown in FIG. 14G and FIG. 14H are then continued, wherein the steps shown in FIG. 14G and FIG. 14H are similar to the steps shown in FIG. 12B to FIG. 12E, so please refer to the related content above, which are not repeated herein.

Figure 14H:
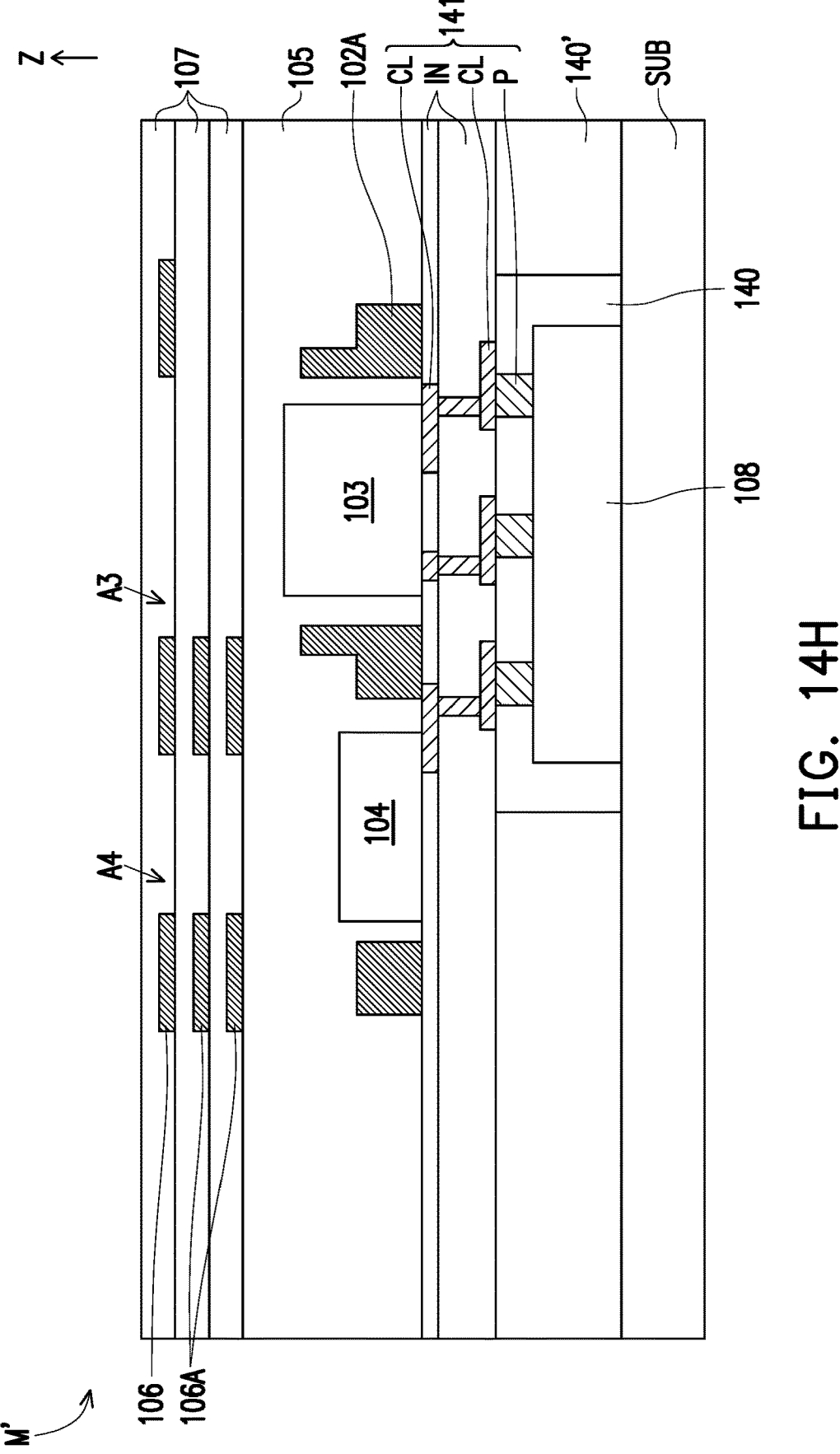

After the steps shown in FIG. 14H are completed, the manufacture of an optical module M' is preliminarily completed. In some embodiments, although not shown, the optical module M' may further include the optical structure 109 and the encapsulation layer 110 as shown in FIG. 10, but the disclosure is not limited thereto.

Figure 15A:
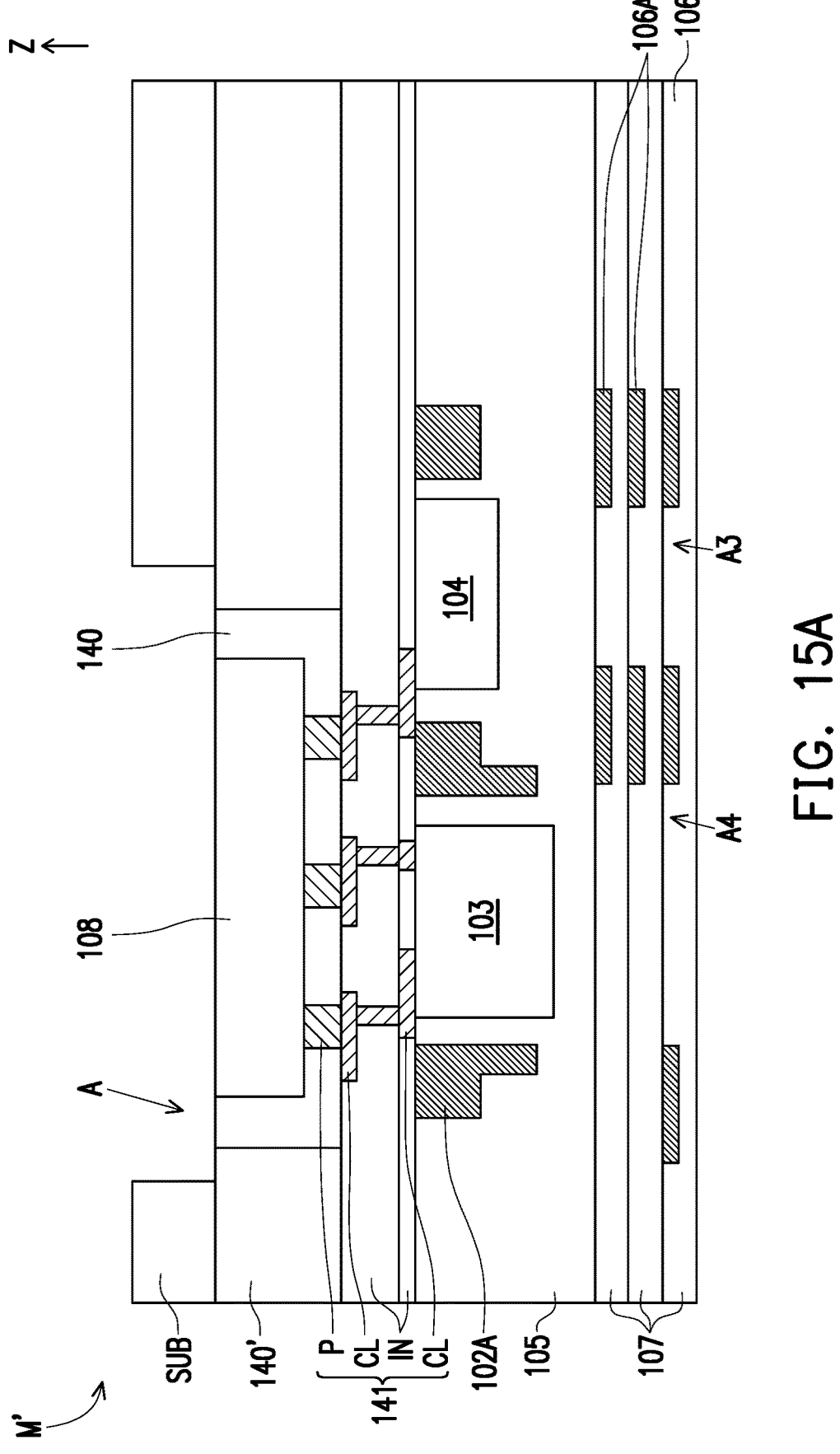
Figure 15B:
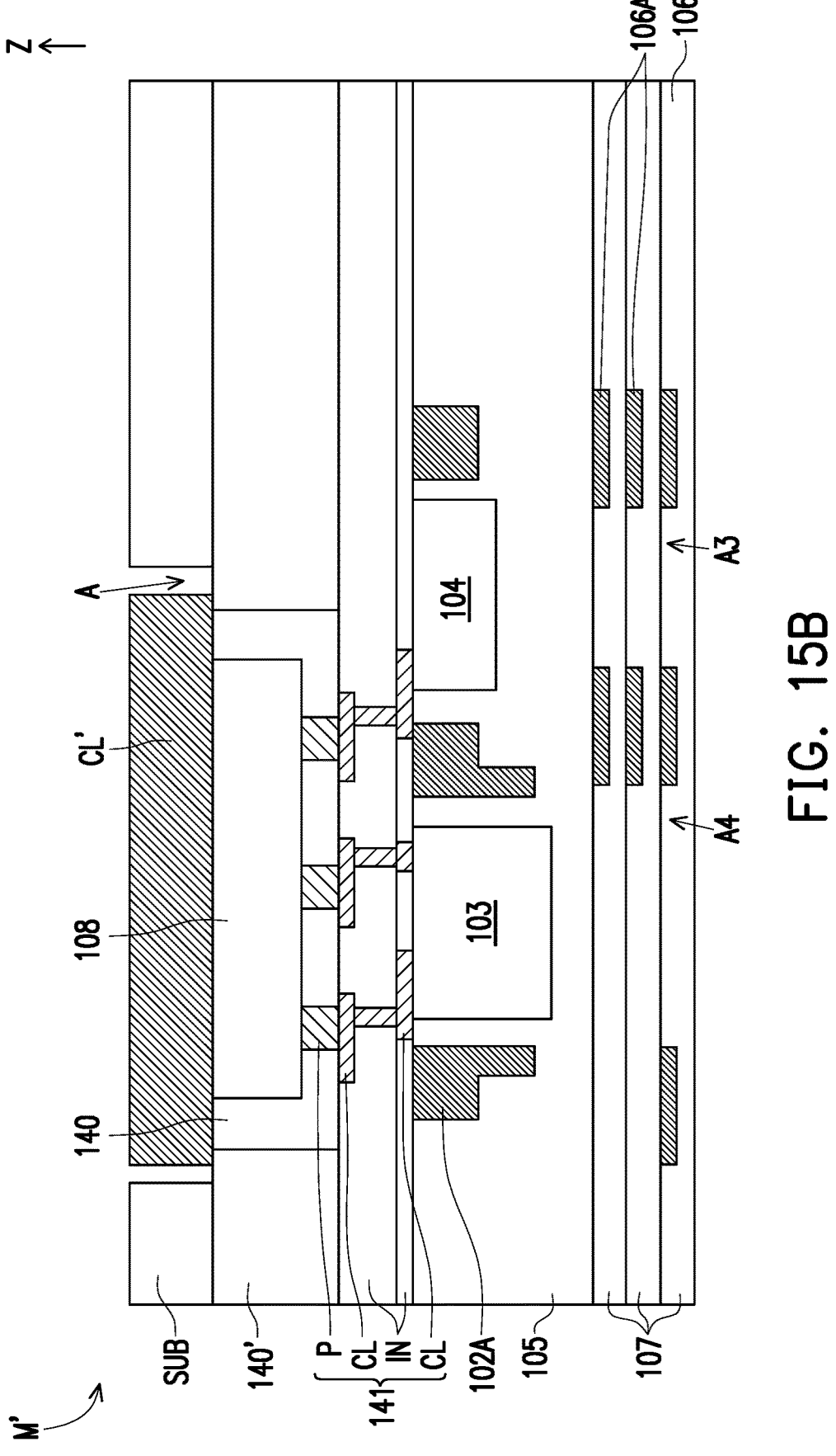
Figure 15C:
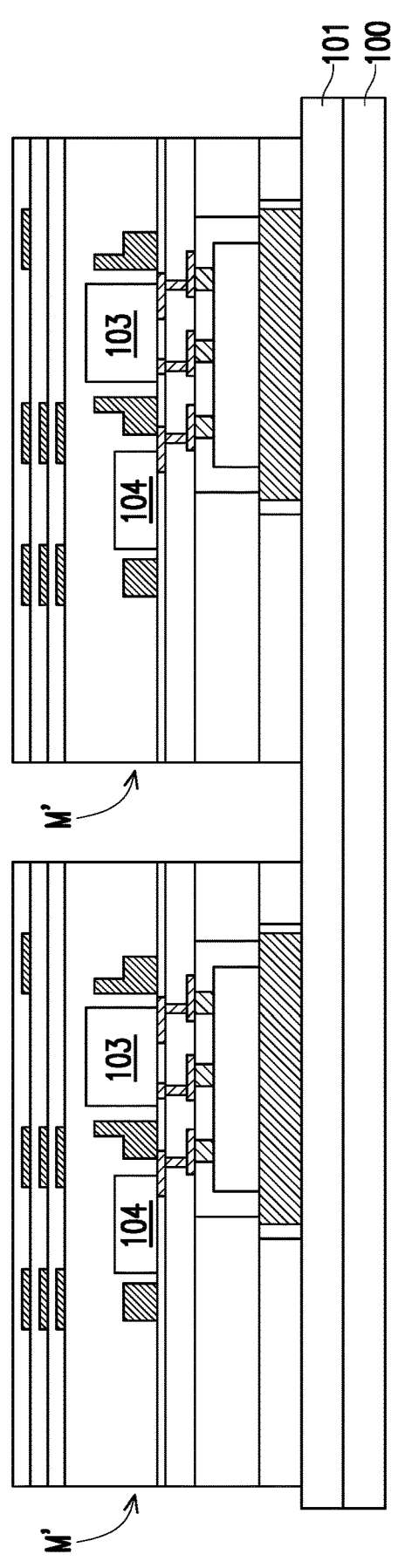
Figure 15D:
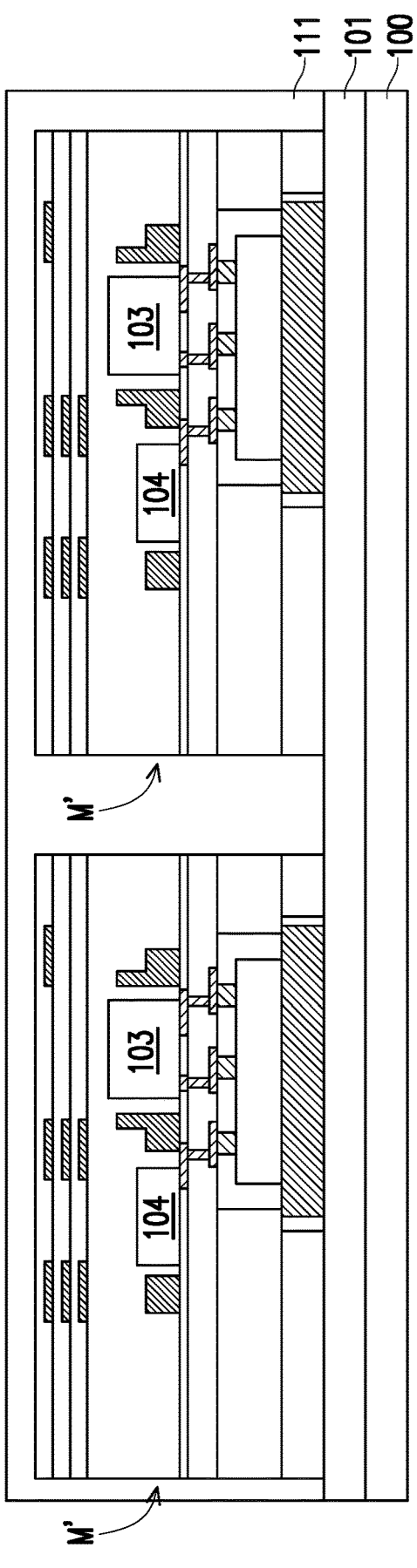
Figure 15E:
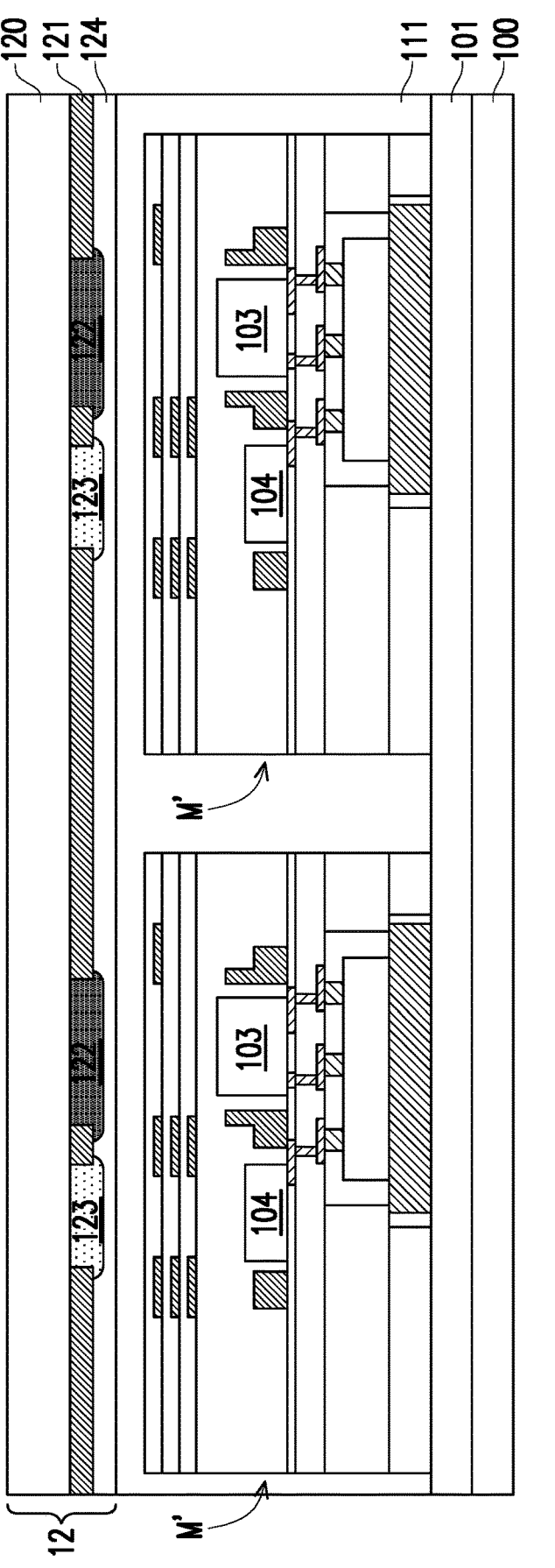

Referring to FIG. 15A, the optical module M' is turned over, and the opening A is formed in the substrate SUB. Next, as shown in FIG. 15B, the conductive layer CL' is formed in the opening A. Then, as shown in FIG. 15C, the substrate 100 is provided, and the conductive layer 101 is formed on the substrate 100, then the optical module M' is turned over, and then the optical module M' is transferred onto the conductive layer 101 and electrically connected to the conductive layer 101. The steps shown in FIG. 15D and FIG. 15E are then continued, wherein the steps shown in FIG. 15D and FIG. 15E are similar to the steps shown in FIG. 13B to FIG. 13C, so please refer to the related content above, which are not repeated herein. After the steps shown in FIG. 15E are completed, the manufacture of the electronic device 1G is preliminarily completed.

The first electronic element 103 is a light-emitting unit including a function of emitting light and the second electronic element 104 is a photosensitive unit including a function of receiving light, and the first electronic element 103 is electrically insulated from the second electronic element 104. However, it should be understood that, the functions of the first electronic element 103 and the second electronic element 104 may be reversed. When the first electronic element 103 has the function of receiving light, the width WA3 of the third opening A3 is, for example, less than the width WA1 of the first opening A1, so as to collimate light or filter stray light. Or, the functions of the first electronic element 103 and the second electronic element 104 may be other functions. For example, the first electronic element 103 may be a varactor diode capable of regulating an electromagnetic wave by changing capacitance value, and the first electronic element 103 has the function of adjusting the capacitance value of the first electronic element 103. Or, the first electronic element 103 may have the function of controlling the second electronic element 104. For example, the first electronic element 103 may be used to drive, turn off, adjust, or change the state of the second electronic element 104, and the first electronic element 103 is electrically connected to the second electronic element 104 via the conductive layer 101, but the disclosure is not limited thereto.

In an embodiment of the disclosure, by transferring a variety of electronic elements having different functions to a substrate formed with a conductive layer, an electronic device having a plurality of functions may be manufactured, which is in conformity with the trend of future electronic products.

The above embodiments are used to describe the technical solution of the disclosure instead of limiting it. Although the disclosure has been described in detail with reference to each embodiment above, those having ordinary skill in the art should understand that the technical solution recited in each embodiment above may still be modified, or some or all of the technical features thereof may be equivalently replaced. These modifications or replacements do not make the essence of the corresponding technical solutions depart from the scope of the technical solution of each embodiment of the disclosure.

Although the embodiments of the disclosure and their advantages are disclosed as above, it should be understood that any person with ordinary skill in the art, without departing from the spirit and scope of the disclosure, may make changes, substitutions, and modifications, and features between the embodiments may be mixed and replaced at will to form other new embodiments. In addition, the scope of the disclosure is not limited to the manufacturing processes, machines, manufactures, material compositions, devices, methods, and steps in the specific embodiments described in the specification. Any person with ordinary skill in the art may understand the current or future development processes, machines, manufactures, material compositions, devices, methods, and steps from the content of the disclosure, which may all be adopted according to the disclosure as long as they may implement substantially the same function or obtain substantially the same result in an embodiment described here. Therefore, the scope of the disclosure includes the above manufacturing processes, machines, manufactures, material compositions, devices, methods, and steps. In addition, each claim constitutes an individual embodiment, and the scope of the disclosure also includes the combination of each claim and embodiment. The scope of the disclosure shall be subject to the scope defined by the following claims.

What is claimed is:

1. A manufacturing method of an electronic device, comprising:
   providing a substrate;
   forming a conductive layer on the substrate;
   forming an insulating layer on the conductive layer;
   patterning the insulating layer to form a first opening and a second opening;
   disposing a first electronic element in the first opening and electrically connecting the first electronic element to the conductive layer; and
   disposing a second electronic element in the second opening and electrically connecting the second electronic element to the conductive layer,
   wherein the first electronic element and the second electronic element have different functions;
   forming a light-shielding layer on the insulating layer;
   patterning the light-shielding layer to form a third opening,
   wherein in a plan view direction of the electronic device, the third opening is overlapped with the first opening; and
   forming a light converting element in the third opening.

2. The manufacturing method of the electronic device of claim 1, wherein the insulating layer is formed by a coating film or a coating process.

3. The manufacturing method of the electronic device of claim 1, wherein the first electronic element has a light-receiving function.

4. The manufacturing method of the electronic device of claim 3, wherein a width of the third opening is less than a width of the first opening.

5. The manufacturing method of the electronic device of claim 1, wherein the first electronic element has a light-emitting function.

6. The manufacturing method of the electronic device of claim 1, wherein the insulating layer is opaque.

7. The manufacturing method of the electronic device of claim 1, wherein the first electronic element has a function of adjusting a capacitance value of the first electronic element.

8. The manufacturing method of the electronic device of claim 1, wherein the first electronic element is electrically insulated from the second electronic element.

9. The manufacturing method of the electronic device of claim 1, wherein the first electronic element is electrically connected to the second electronic element via the conductive layer.

10. The manufacturing method of the electronic device of claim 9, wherein the first electronic element has a function of controlling the second electronic element.

* * * * *